United States Patent
Takahashi

(10) Patent No.: US 9,754,986 B2
(45) Date of Patent: Sep. 5, 2017

(54) SOLID-STATE IMAGING DEVICE

(71) Applicant: Panasonic Intellectual Property Management Co., Ltd., Osaka (JP)

(72) Inventor: Towa Takahashi, Toyama (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 15/245,874

(22) Filed: Aug. 24, 2016

(65) Prior Publication Data

US 2016/0365377 A1    Dec. 15, 2016

Related U.S. Application Data

(63) Continuation of application No. PCT/JP2015/000550, filed on Feb. 6, 2015.

(30) Foreign Application Priority Data

Feb. 28, 2014    (JP) .................................. 2014-039300

(51) Int. Cl.
*H01L 27/146*    (2006.01)
*G02B 3/08*    (2006.01)
(Continued)

(52) U.S. Cl.
CPC ...... *H01L 27/14627* (2013.01); *G02B 3/0056* (2013.01); *G02B 3/08* (2013.01);
(Continued)

(58) Field of Classification Search
CPC ......... H01L 27/14627; H01L 27/14685; H01L 27/14621; H01L 27/14645;
(Continued)

(56) References Cited

U.S. PATENT DOCUMENTS

2004/0257460 A1* 12/2004 Kuriyama .............. H04N 9/045
                                                              348/340
2006/0284052 A1    12/2006 Toshikiyo et al.
(Continued)

FOREIGN PATENT DOCUMENTS

JP    2006-351972 A    12/2006
JP    2009-015315 A    1/2009
(Continued)

OTHER PUBLICATIONS

International Search Report issued in PCT/JP2015/000550 dated Apr. 28, 2015 with English translation.

*Primary Examiner* — Galina Yushina
(74) *Attorney, Agent, or Firm* — McDermott Will & Emery

(57) ABSTRACT

A solid-state imaging device includes unit pixels arrayed two dimensionally in a pixel area, wherein: a unit pixel disposed in a central region of the pixel area includes a first collecting element having a convex surface and a unit pixel in a region of the pixel area not including the central region includes a second collecting element having a convex surface and grooves having widths less than or equal to a wavelength of incident light; the second collecting element includes a sparse region and a dense region in which a density of formations of the grooves is higher than in the sparse region; and the sparse region is positioned closer to the central region of the pixel area than the dense region.

13 Claims, 25 Drawing Sheets

(51) Int. Cl.
*H01L 31/054* (2014.01)
*G02B 3/00* (2006.01)
*G02B 27/00* (2006.01)
*H04N 5/369* (2011.01)
*H01L 31/00* (2006.01)
*H04N 5/357* (2011.01)

(52) U.S. Cl.
CPC ..... *G02B 27/0025* (2013.01); *G02B 27/0037* (2013.01); *H01L 27/14621* (2013.01); *H01L 27/14645* (2013.01); *H01L 27/14685* (2013.01); *H01L 31/054* (2014.12); *H04N 5/369* (2013.01); *H04N 5/3572* (2013.01)

(58) Field of Classification Search
CPC ............. H01L 27/14667; H01L 27/146; H01L 27/307; H01L 31/054; H01L 31/0543; G02B 3/0056; G02B 3/08; G02B 3/0006; G02B 5/1876; G02B 21/364; G02B 27/0037; G02B 27/0025
See application file for complete search history.

(56) References Cited

U.S. PATENT DOCUMENTS

| | | |
|---|---|---|
| 2007/0069108 A1 | 3/2007 | Inaba |
| 2009/0020690 A1 | 1/2009 | Toda |
| 2009/0020840 A1 | 1/2009 | Toshikiyo et al. |
| 2012/0211850 A1* | 8/2012 | Kuboi ................. H01L 27/1462 257/432 |
| 2014/0103478 A1* | 4/2014 | Usuda ............... H01L 27/14621 257/432 |

FOREIGN PATENT DOCUMENTS

| | | | |
|---|---|---|---|
| JP | 4456040 B2 | 4/2010 | |
| JP | WO2013161168 | * 10/2013 | ............. H01L 27/14 |
| WO | 2005/076361 A1 | 8/2005 | |
| WO | 2013/080872 A1 | 6/2013 | |
| WO | 2013/161168 A1 | 10/2013 | |

* cited by examiner

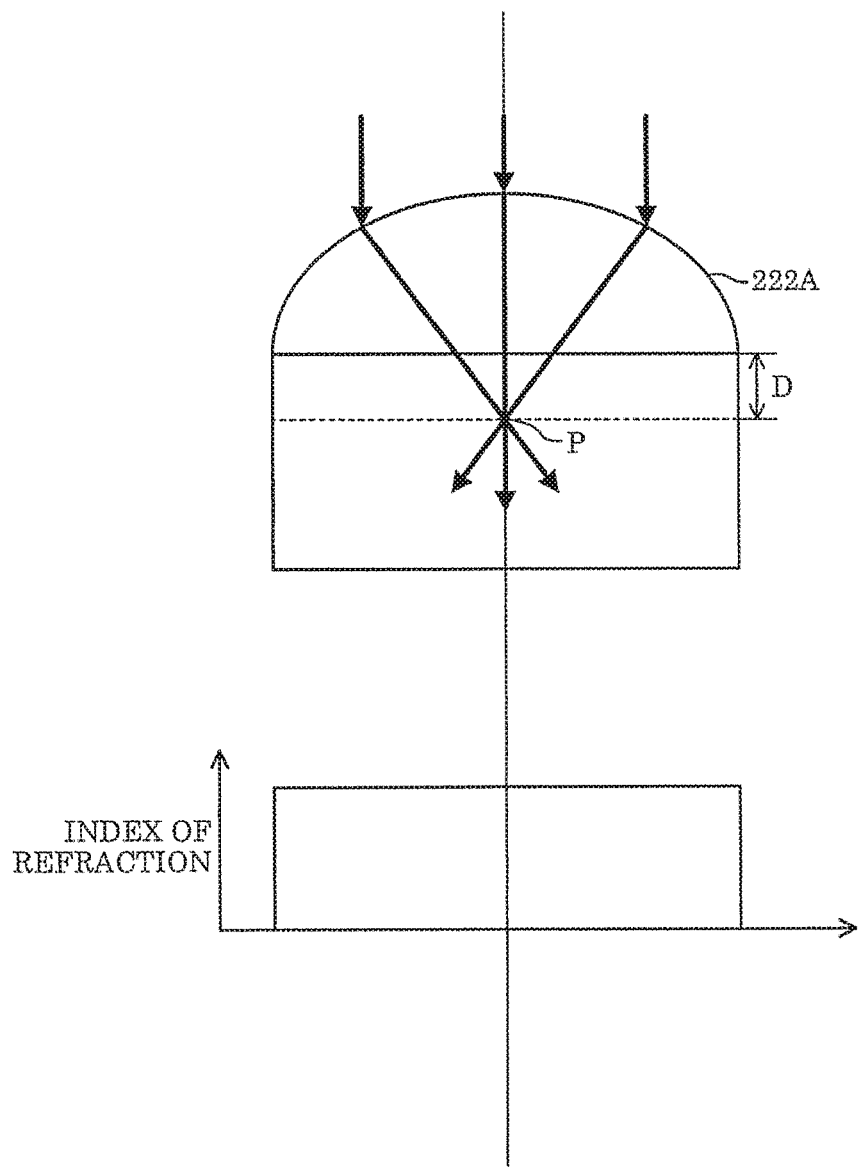

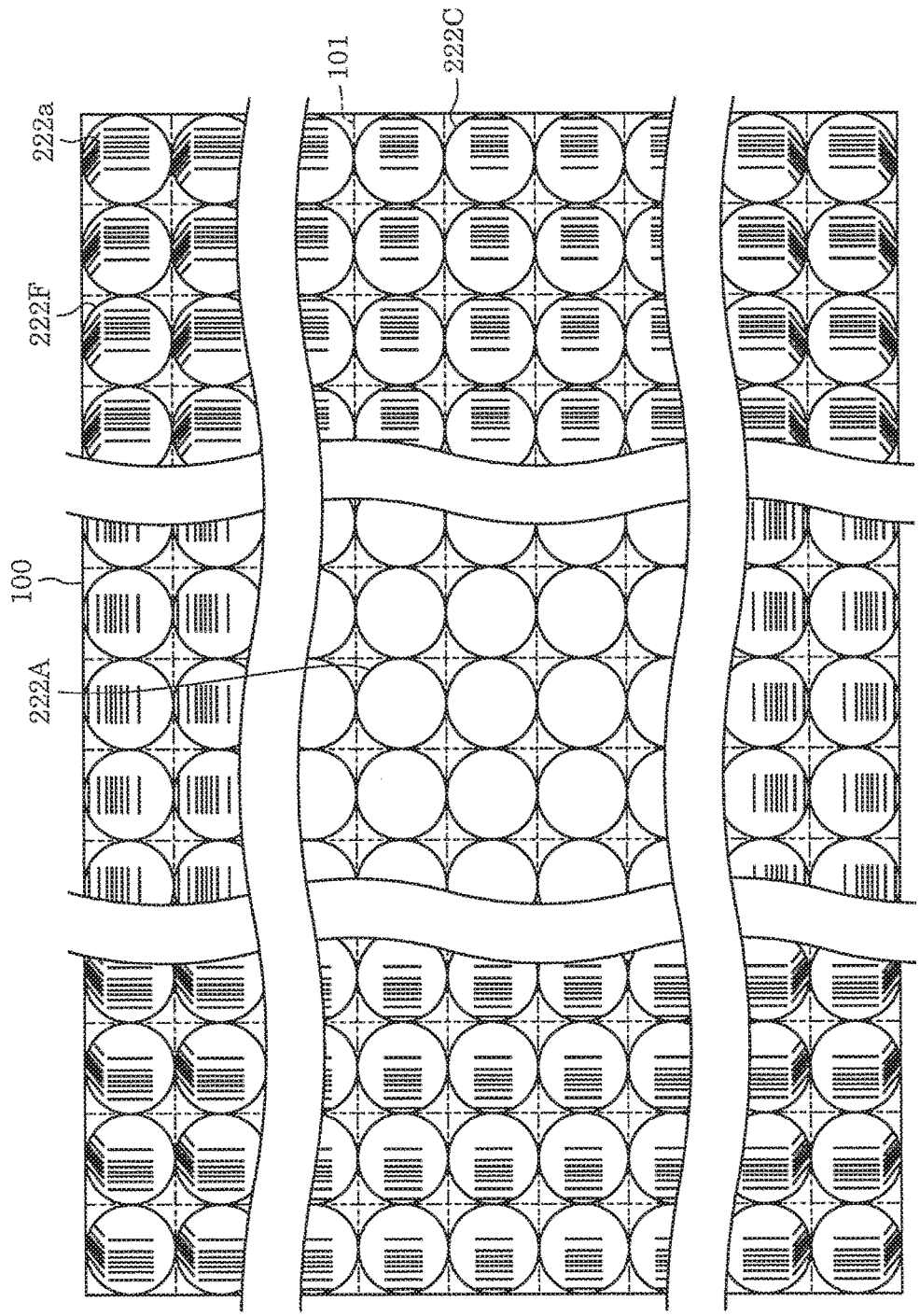

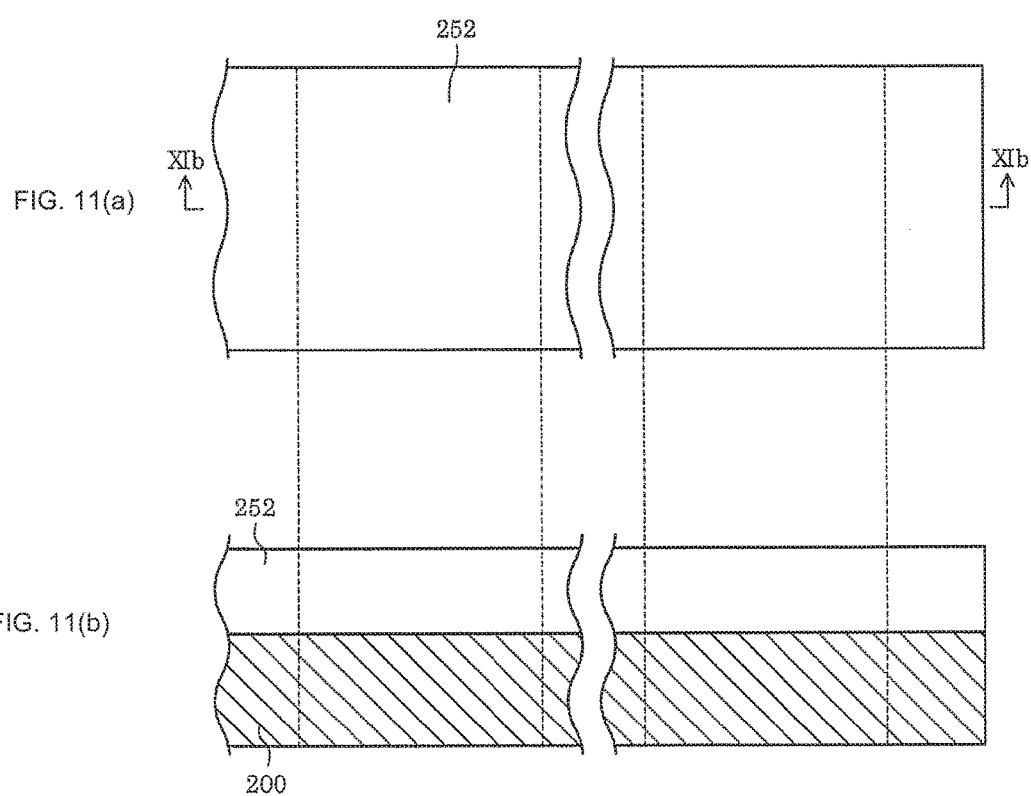

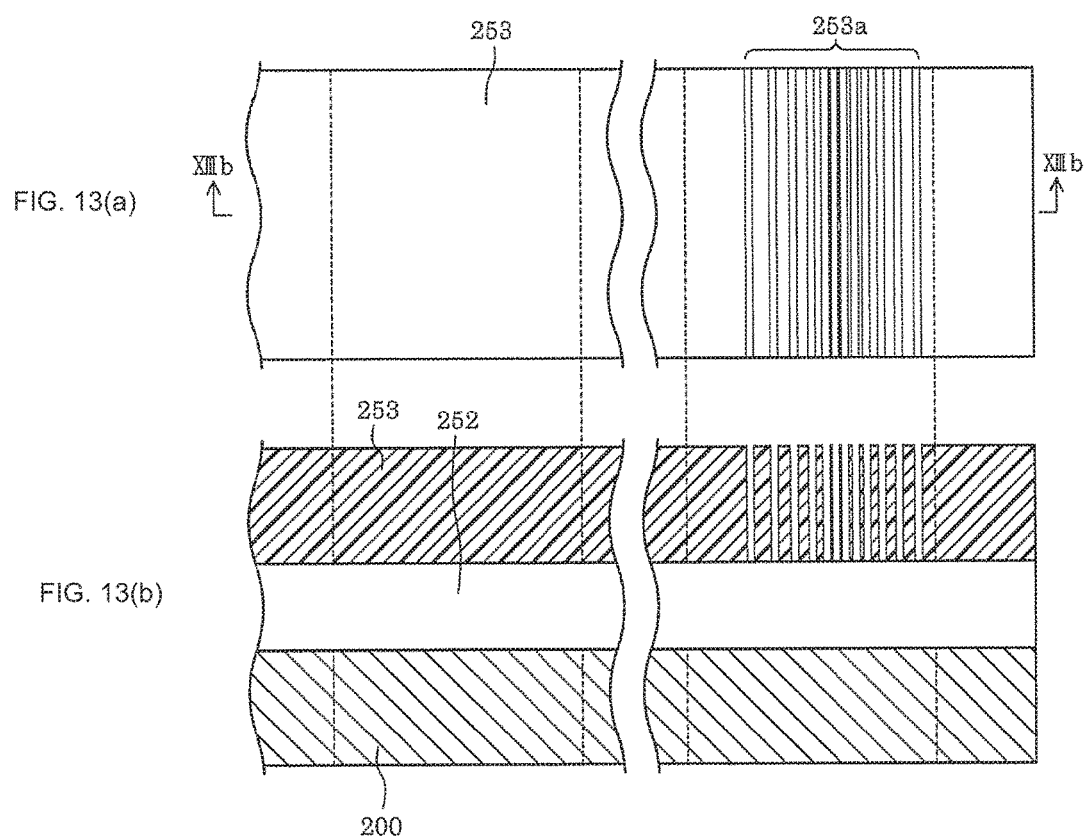

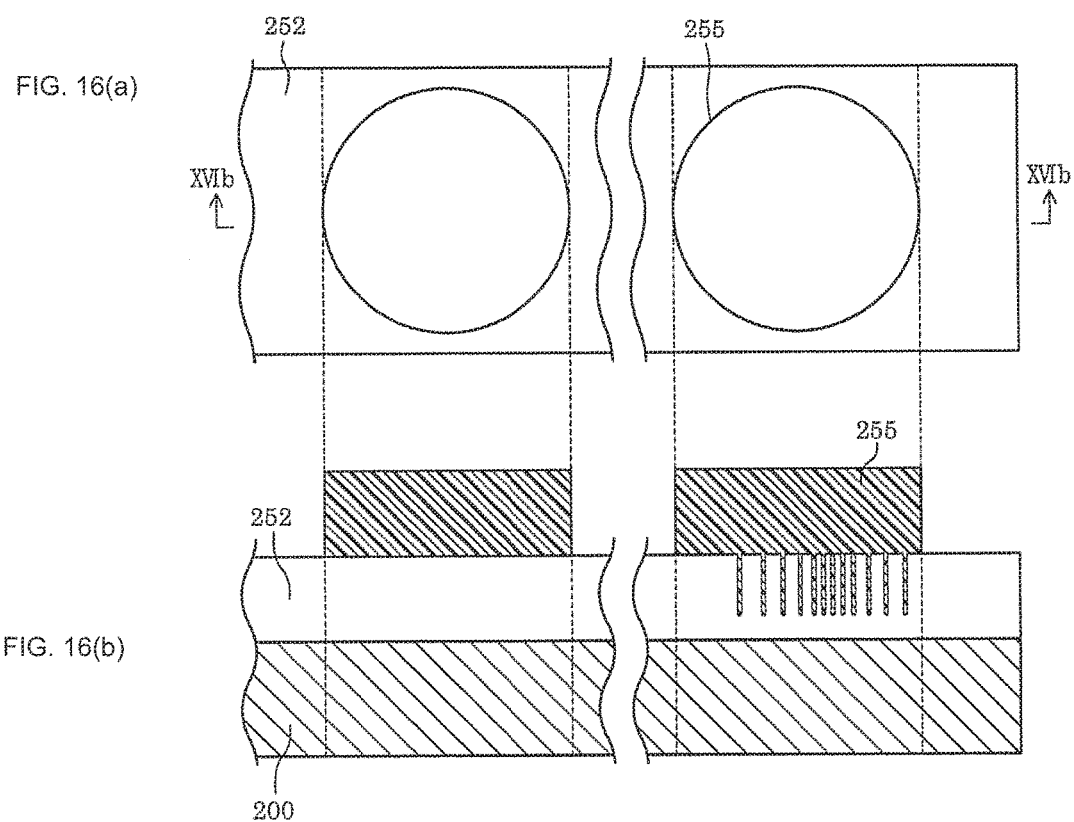

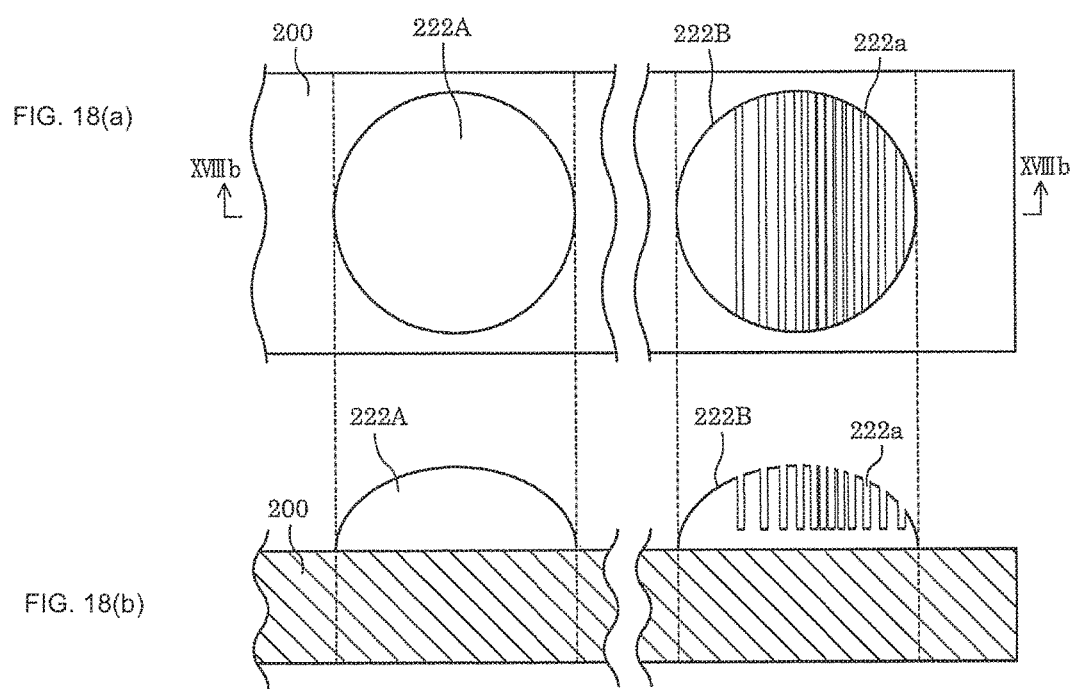

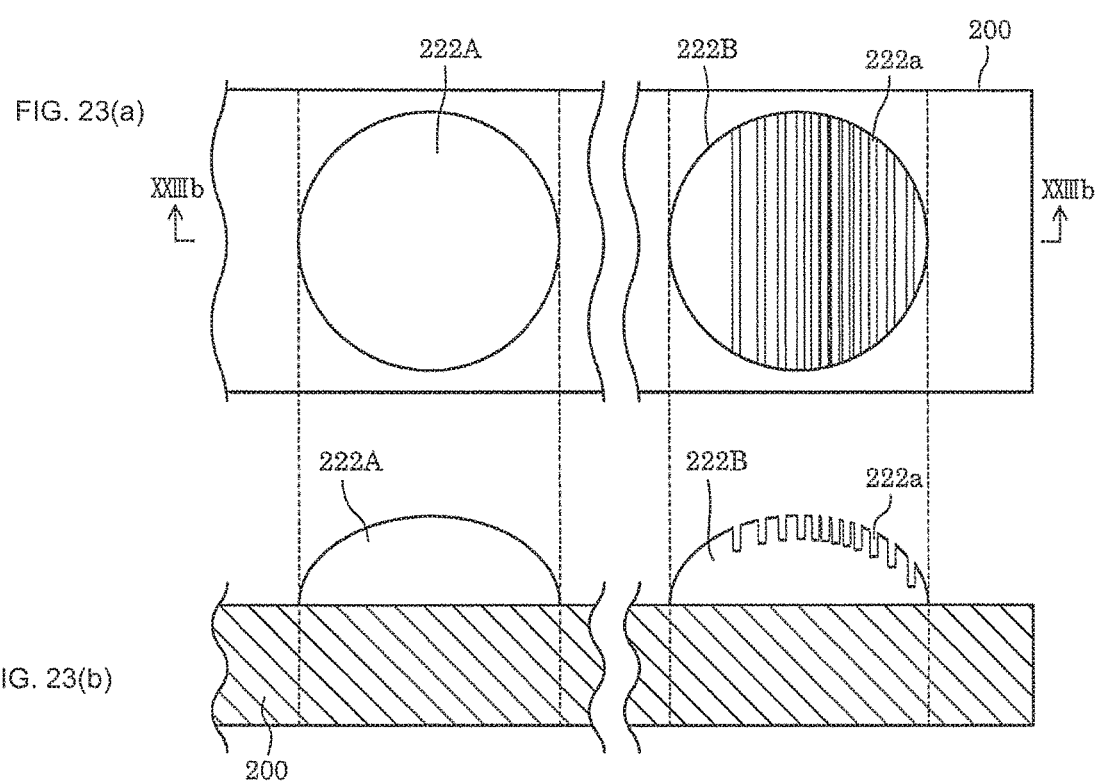

SOLID-STATE IMAGING DEVICE

This application is a U.S. continuation application of PCT International Patent Application Number PCT/JP2015/000550 filed on Feb. 6, 2015, claiming the benefit of priority of Japanese Patent Application Number 2014-039300 filed on Feb. 28, 2014, the entire contents of which are hereby incorporated by reference.

BACKGROUND OF THE INVENTION

1. Technical Field

The present disclosure relates to a solid-state imaging device.

2. Description of the Related Art

With the growing popularity of digital cameras, camera-equipped mobile phones, vehicle cameras, etc., there is demand for miniaturization, higher pixel resolution, and sensitization of solid-state imaging devices. In order to sensitize a solid-state imaging device, it is common to include a collecting element, described by such a name as a micro lens, in each pixel. Provision of the collecting element that focuses on a surface of a light-receiving element enhances efficiency of light collection into the light-receiving element. Meanwhile, light incident on pixels in the central region of a pixel area and light incident on pixels in a perimeter region of the pixel area differ in component. A great amount of light is incident onto the central region of the pixel area from the normal, whereas a great amount of light is incident onto the perimeter region of the pixel area from oblique direction. A typical collecting element is designed to collect the incident light from the normal into a focal point. For this reason, the collecting element can efficiently collect the incident light from the normal, while the collection efficiency for the incident light from oblique direction decreases. Thus, a problem arises that sensitivity of the pixel area decreases greater in the perimeter region than in the central region.

It is contemplated to dispose convex lenses having different shapes in the central region and perimeter region of the pixel area in order to ameliorate the problem that the sensitivity of the pixel area decreases toward the perimeter region. However, it is very difficult and impractical to achieve properly controlled positioning of the convex lenses in a matrix. For this reason, use of graded index lenses having periodic structures comprising different materials having different indices of refraction are discussed (e.g., see Japanese Unexamined Patent Application Publication No. 2006-351972).

SUMMARY

However, the use of graded index lenses makes it difficult to achieve short focal lengths. In order to achieve a graded index lens having a short focal length, deep grooves are required and deep grooves are difficult to form. Thus, a graded index lens that has a short focal length cannot readily be achieved. A graded index lens that has a long focal length is difficult to use particularly for a back side illumination (BSI) solid-state imaging device which includes a substrate whose surface provided with lines is opposite a light-incident surface.

An object of the present disclosure is to achieve a solid-state imaging device which includes collecting elements each of which has a short focal length and provide uniformity in light collection efficiency of pixels.

One aspect of a sold-state imaging device according to the present disclosure includes: unit pixels arrayed two-dimensionally in a pixel area of a substrate, the unit pixels including, in one-to-one correspondence: photoelectric converters; and collecting elements which collect incident light, the collecting elements including: a first collecting element having a convex surface, the first collecting element being formed in a unit pixel disposed in a central region of the pixel area among the unit pixels; and a second collecting element having a convex surface and grooves having widths less than or equal to a wavelength of the incident light, the second collecting element being formed in a unit pixel disposed in a region of the pixel area not including the central region, among the unit pixels, wherein the second collecting element has, in plan view of the substrate: a sparse region; and a dense region in which a density of formations of the grooves is higher than the density of formations of the grooves in the sparse region, and the sparse region of the second collecting element is positioned closer to the central region of the pixel area than the dense region of the second collecting element is.

First aspect of a method for fabricating the solid-state imaging device according to the present disclosure includes: preparing a substrate which has a pixel area in which photoelectric converters are two-dimensionally arrayed; forming over the pixel area a collecting-element forming film for collecting incident light; forming grooves in the collecting-element forming film at positions corresponding to the photoelectric converters in a region not including a central region of the pixel area, the grooves having widths less than or equal to a wavelength of the incident light; and after forming the grooves, forming a first collecting element without the grooves in the central region of the pixel area and a second collecting element having the grooves in the region of the pixel area not including the central region, by etching the collecting-element forming film, wherein the second collecting element has, in plan view of the substrate: a sparse region; and a dense region in which a density of formations of the grooves is higher than e density of formations of the grooves in the sparse region, and the sparse region of the second collecting element is positioned closer to the central region of the pixel area than the dense region of the second collecting element is.

Second aspect of the method according to the present disclosure includes preparing a substrate which has a pixel, area in which photoelectric converters are two-dimensionally arrayed; forming over the pixel area a collecting-element forming film for collecting incident light; deforming the collecting-element forming film to give the collecting-element forming film convex surfaces at positions corresponding to the photoelectric converters by etching the collecting-element forming film; and after deforming the collecting-element forming film, forming grooves in the collecting-element forming film in a region not including a central region of the pixel area, the grooves having widths less than or equal to a wavelength of the incident light, wherein forming the grooves includes forming a first collecting element without the grooves in the central region of the pixel area and forming a second collecting element having the grooves in the region of the pixel area not including the central region, the second collecting element has, in plan view of the substrate: a sparse region; and a dense region in which a density of formations of the grooves is higher than in the sparse region, and the sparse region of the second collecting element is positioned closer to the central region of the pixel area than the dense region of the second collecting element is.

According to the solid-state imaging device of the present disclosure, the solid-state imaging device is achieved which includes collecting elements each of which has a short focal length and provide uniformity in light collection efficiency of pixels.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

FIG. 3 shows (a) a cross sectional view of a first collecting element, and (b) a diagram illustrating a refraction index distribution in the first collecting element;

FIG. 10 is a plan view of a first variation of the solid-state imaging device according to the embodiment;

FIG. 11 shows (a) a plan view illustrating a step in a method for fabricating the solid-state imaging device according to the embodiment, and (b) a cross sectional view taken along XIb-XIb in (a);

FIG. 13 shows (a) a plan view illustrating a step in the method for fabricating the solid-state imaging device according to the embodiment, and (b) a cross sectional view taken along XIIIb-XIIIb in (a);

FIG. 16 shows (a) a plan view illustrating a step in the method for fabricating the solid-state imaging device according to the embodiment, and (b) a cross sectional view taken along XVIb-XVIb in (a);

FIG. 18 shows (a) a plan view illustrating a step in the method for fabricating the solid-state imaging device according to the embodiment, and (b) a cross sectional view taken along XVIIIb-XVIIIb in (a);

FIG. 23 shows (a) a plan view illustrating a step in the variation of the method for fabricating the solid-state imaging device according to the embodiment, and (b) a cross sectional view taken along XXIIIb-XXIIIb in (a);

DETAILED DESCRIPTION OF THE EMBODIMENT

A solid-state imaging device according to the present embodiment of the present disclosure is described with reference to the accompanying drawings.

Figure 1:
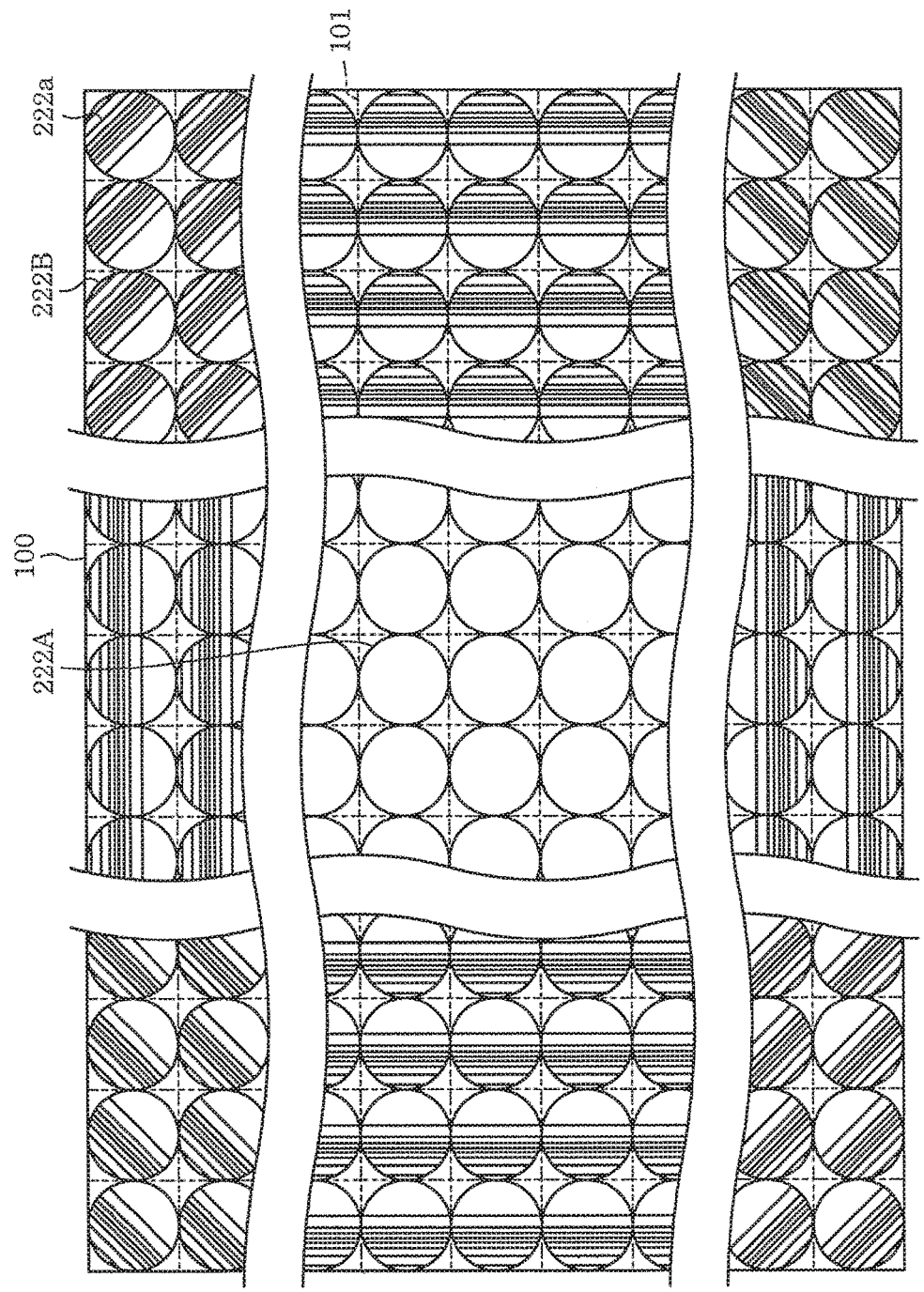
FIG. 1 is a plan view of a solid-state imaging device according to an embodiment of the present disclosure.
Figure 2:
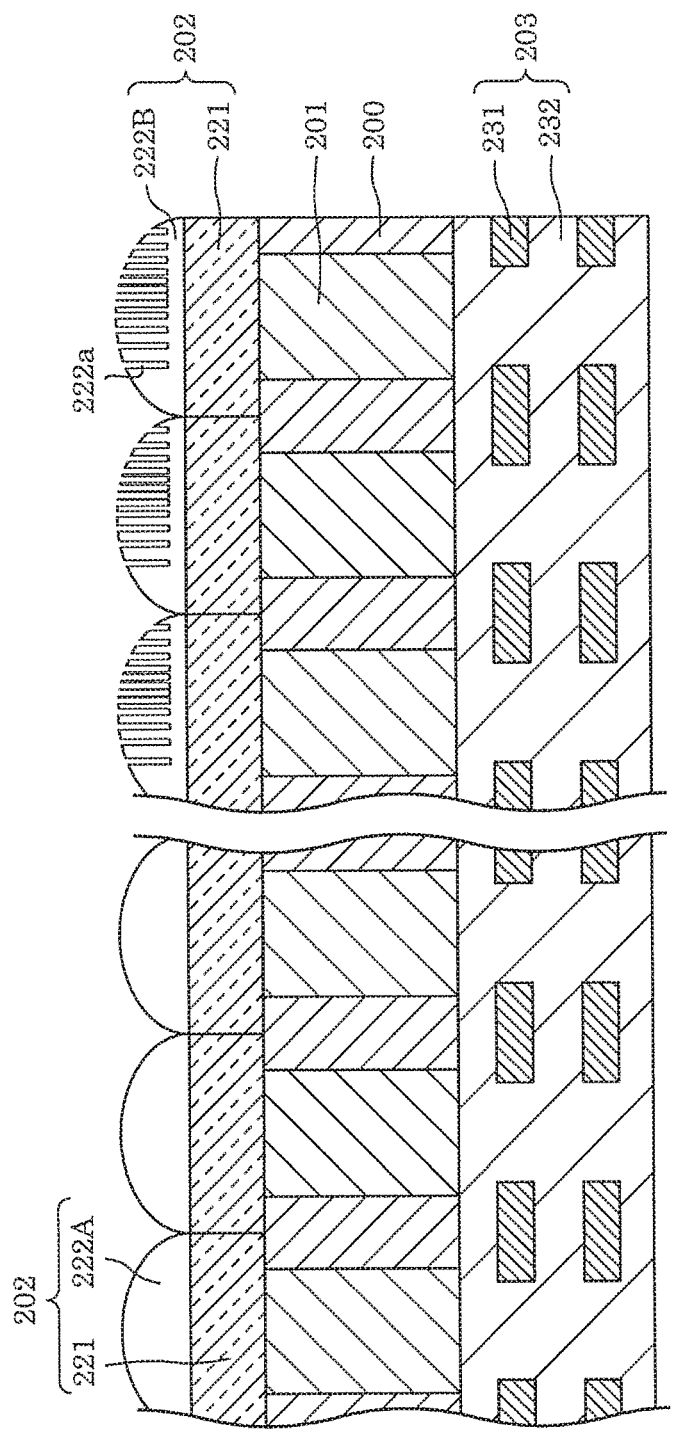
FIG. 2 is a cross sectional view of the solid-state imaging device according to the embodiment.

FIG. 1 is a plan view of the solid-state imaging device according to the embodiment of the present disclosure. FIG. 2 is a cross sectional view of the solid-state imaging device according to the embodiment.

As shown in FIGS. 1 and 2, the solid-state imaging device according to the present embodiment includes unit pixels 101 two-dimensionally arrayed in pixel area 100. In the following, the present embodiment is described with reference to unit pixels 101 having a size of, but not particularly limited to, about 4 µm square. In the following figures, components are not to scale and may not reflect the actual size.

Unit pixels 101 are disposed on semiconductor substrate 200, each including photoelectric converter 201, collecting portion 202, and line portion 203. Collecting portions 202 and line portions 203 are disposed on opposing surfaces of semiconductor substrate 200.

Photoelectric converter 201, for example, includes a photo diode as a light-receiving element. Collecting portions 202 formed over a light-incident surface of substrate 200 each include color filter 221 in one-to-one correspondence with photoelectric converter 201, and one of first collecting element 222A and second collecting element 222B over color filter 221. Specifically, the solid-state imaging device according to the present disclosure includes collecting portion 202 that includes color filter 221 and first collecting element 222A, and collecting portion 202 that includes color filter 221 and second collecting element 222B. Color filters 221 can form a Bayer array, for example. Line portion 203 includes line 231 and insulating film 232 covering line 231.

In one aspect of the solid-state imaging device, the unit pixels may each include: one of the photoelectric converters on a first major surface of the substrate; and a line portion on a second major surface of the substrate, the first major surface and the second major surface being opposing surfaces of the substrate, and the second collecting element is disposed over the first major surface of the substrate.

In FIG. 3, (a) is a cross sectional view of first collecting element 222A, and (b) is a diagram illustrating a refraction index distribution in first collecting element 222A. As shown in FIG. 1 and (a) of FIG. 3, unit pixels 101 in a central region of pixel area 100 each include first collecting element 222A which is a convex lens having a typical convex surface. First collecting element 222A comprises a collecting element material which has a greater index of refraction than an air, for example. Examples of the collecting element material include silicon oxide. As shown in (b) of FIG. 3, the index of refraction is constant throughout first collecting element 222A, and focus position P of the light incident on first collecting element 222A from the normal to the substrate surface is lying on the central axis of first collecting element 222A.

Figure 4A:
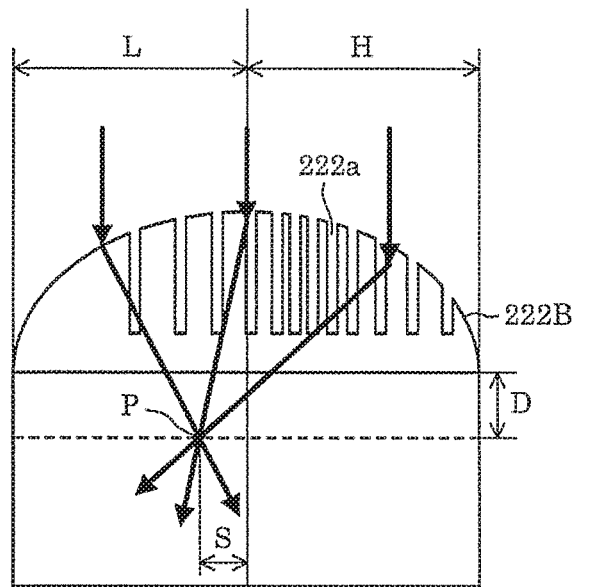
FIG. 4 shows (a) a cross sectional view of a second collecting element; (b) a diagram illustrating an effective refraction index distribution in the second collecting element; and (c) a cross sectional view of a collecting element which has optical characteristics equivalent to those of the second collecting element.
Figure 4B:
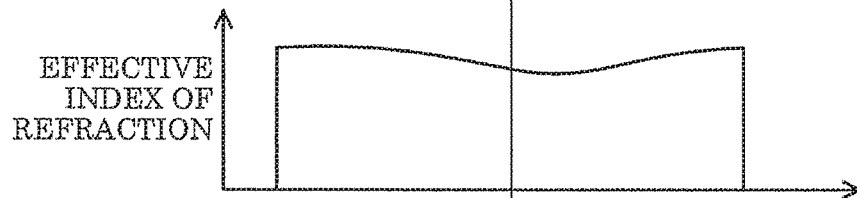
Figure 4C:
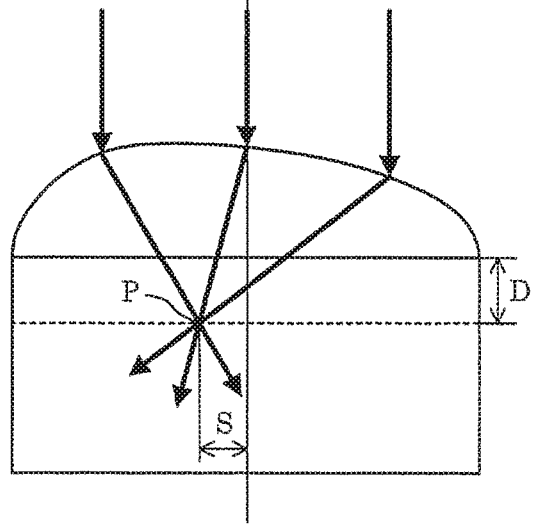

In FIG. 4, (a) is a cross sectional view of second collecting element 222B; (b) is a diagram illustrating an effective refraction index distribution in second collecting element 222B; and (c) is a cross sectional view of a collecting element which has optical characteristics equivalent to those of second collecting element 222B. As shown in FIG. 1 and (a) of FIG. 4, unit pixels 101 that are disposed in regions of pixel area 100 not including the central region each include second collecting element 222B which has the convex surface and grooves 222a that are generally parallel to each other in cross-sectional view and plan view of the substrate. A portion of second collecting element 222B not including grooves 222a is formed of a collecting element material which is the same as that included in first collecting element 222A. Groove 222a is typically occupied with an air. However, groove 222a may instead be filled with a material which has a less index of refraction than the collecting element material.

In one aspect of the solid-state imaging device, grooves 222a may be disposed in parallel to one another.

While the present embodiment is described with reference to grooves 222a that are linear, grooves 222a are not limited to be linear. However, using a linear pattern in photolithography allows an increase of accuracy in forming grooves 222a by using dipole illumination or polarized illumination, for example. For this reason, grooves 222a that are linear yield advantages of ease of processing of grooves 222a. Moreover, they also yield advantages of increasing offset s of focus position P.

Density of formations of grooves 222a in second collecting element 222B is not constant. Grooves 222a are formed asymmetrically in one second collecting element 222B. Specifically, a density of formations of grooves 222a is higher on one side of second collecting element 222B than on the other side. Part (a) of FIG. 4 illustrates an example of second collecting element 22213 the left side of which in the figure is L region and the right side of which is H region. The density of formations of grooves 222a in H region is higher than in L region. H region and L region are facing in second collecting element 222B. The higher the density of formations of grooves 222a, the less the effective index of refraction of second collecting element 222B. The effective index of refraction is an averaged index of refraction of an index of refraction of the collecting element material and an index of refraction of the air occupying grooves 222a. For this reason, as illustrated in (b) of FIG. 4, the effective refraction index distribution in second collecting element 22213 exhibits that the effective index of refraction is less in H region than in L region. It should be noted that the density of formations of grooves 222a refers to a volume of grooves 222a as a percent of a unit volume of second, collecting element 222B.

If widths w of grooves 222a are sufficiently narrow as much as equal to or less than wavelength $\lambda$ of the light incident on second collecting element 222B, the light incident on second collecting element 222B refracts according to the effective index of refraction, rather than according to an index of refraction unique to the collecting element material. For this reason, the light incident on second collecting element 222B refracts according to an effective index of refraction that depends on the density of formations of grooves 222a.

Widths w of grooves 222a are, preferably, $\lambda/2n$ or less, where $\lambda$ represents a wavelength of the light, incident on the collecting element, and n represents an index of refraction of the collecting element material. A light wavelength which affects second collecting element 222B is not wavelength $\lambda$ in air, but wavelength $\lambda/n$ in the collecting element material. Further, since the effective index of refraction in second collecting element 22213 are averaged based on a ratio in terms of forming density between grooves 222a occupied with air and a portion of second collecting element 222B filled with the collecting element material, the effective index of refraction can be controlled, effectively when grooves 222a have widths of $\lambda/2n$ or less. It should be noted that grooves 222a may not have a same width so long as the widths are $\lambda/2n$ or less.

A typical solid-state imaging device receives visible light incident thereon. The incident light on the typical solid-state imaging device thus has wavelength $\lambda$ of about 360 nm to about 830 nm. Moreover, if the collecting element material is silicon oxide, the solid-state imaging device has refractive index n of about 1.45 to about 1.5. Thus, widths w of grooves 222a in this case may be less than about 120 nm. For example, a minimum value of widths w of grooves 222a can be about 90 nm. If the wavelength of the light incident on photoelectric converter 201 is limited due to a color filter or the like, $\lambda$ can be a wavelength of light which transmits through the color filter. For example, widths w of grooves 222a may be about 270 nm or less for unit pixel 101 on which red light is incident. Alternatively, if an infrared sensor or the like is used rather than a visible light sensor, widths w of grooves 222a may even be wider than 270 nm.

Second collecting element 222B, in which the density of formations of grooves 222a is higher in H region than in L region, has light collection properties similar to those of a deformable lens one side of which corresponding to H region is thinner than the other side corresponding to L region, as illustrated in (c) of FIG. 4. As a result, focus position P of the light incident on second, collecting element 222B from the normal is positioned offset by s to the L region side from the central axis of second collecting element 222B. If grooves 222a are linear extending in one direction, the position to which focus position P is offset is in a direction orthogonal to the direction of extension of grooves 222a. It should be noted that depth D of focus, which is a distance starting from the bottom surface of second collecting element 222B, is substantially the same as in the case of first collecting element 222A.

In one aspect of the solid-state imaging device, grooves 222a in second collecting element 222B may have a constant depth.

Offset s of focus position P from the central axis of second collecting element 222B depends on an effective refraction index distribution. Thus, offset s increases with increasing density of formations of grooves 222a.

Predetermined offset s can be achieved by forming grooves 222a only in a predetermined region of second collecting element 222B, at a constant density. However, the incident light can effectively be utilized when the effective index of refraction smoothly varies in second collecting element 222B. For this reason, preferably, the density of formations of grooves 222a smoothly varies throughout second collecting element 222B and thereby the effective index of refraction continuously varies in second collecting element 222B.

For example, preferably, in second collecting element 222B, the density of formations of grooves 222a gradually increases from the L region toward H region, the density of formations of grooves 222a is the highest in H region, and gradually decreases toward an edge of H region away from L region. The density of formations of grooves 222a depends on widths, depths, and spacing between grooves 222a for example. However, if grooves 222a have substantially a constant; width and positions of the bottoms of grooves 222a are constant, the spacing between grooves 222a has the greatest impact on the density of formations of grooves 222a. For this reason, changing the spacing between grooves 222a changes the density of formations of grooves 222a. Thus, as illustrated in (a) of FIG. 4, the spacing between grooves 222a can be provided so as to gradually decrease from an edge of the L region away from H region toward H region, be the narrowest in H region, and gradually increase toward an edge of H region away from the L region. A portion in H region where the density of formations of grooves 222a is highest may be determined as appropriate according to a requisite offset s of focus position P. However, typically, for example, the density of formations of grooves 222a in H region is highest on the L region side from the central portion of the region. In other words, in one aspect of the solid-state imaging device, the density of formations of grooves 222a in a dense region may be high on a sparse region side from the central portion of the dense region.

Further, from the standpoint of continuous varying of the effective index of refraction, in second collecting element 222B, preferably, the groove density is made high by reducing the widths of grooves 222a as much as possible. High groove density allows offset s to be closely controlled according to light obliquely incident on second collecting element 222B, thereby increasing the use efficiency of the incident light. Moreover, the surface area of second collecting element 222B available for use as lens increases with reducing widths of grooves 222a, thereby further increasing the use efficiency of the incident light.

While grooves 222a do not extend through second collecting element 222B in the present embodiment, grooves 222a may extend through second collecting element 222B. The deeper the grooves 222a, the higher the density of formations of grooves 222a becomes, thereby further increasing offset s of focus position P. On the other hand, from the standpoint of ease of formations of grooves 222a, preferably, a maximum depth of grooves 222a is about 500 nm or less.

In the solid-state imaging device according to the present embodiment, as shown in FIG. 1, unit pixels 101 in the central region of pixel area 100 each include first collecting element 222A without grooves 222a. On the other hand, unit pixels 101 in the regions of pixel area 100, not including the central region, each include second collecting element 222B having grooves 222a. Light is obliquely incident greater on unit pixel. 101 in the perimeter region of pixel area 100 than unit pixel 101 in the central region of pixel area 100. For this reason, if focus position P of the light incident from the normal on unit pixel 101 in the perimeter region is at the center of unit pixel 101, the light collection efficiency of unit pixel 101 decreases. However, second collecting elements 222B included in the solid-state imaging device according to the present embodiment each have focus position P offset from the center of unit pixel 101. Thus, even the light that is incident on unit pixels 101 disposed in the perimeter region are effectively collected.

In one aspect of the solid-state imaging device, the grooves in the second collecting element may linearly extend in a direction intersecting a straight line joining a center of the pixel area and a center of the unit pixel that includes the second collecting element.

The direction of incidence of light on unit pixel 101 depends on a position of unit pixel 101. For this reason, the e orientation of second collecting element 222B depends on the position of unit pixel 101. Specifically, second collecting element 222B is disposed such that L region in which the density of formations of grooves 222a is lower than in H region is on the central region side of pixel area 100 and H region in which the density of formations of grooves 222a is higher than in L region is on the perimeter side of pixel area 100. For example, if grooves 222a are linear extending in one direction, second collecting element 222B may be arranged in a manner that the direction of extension of grooves 222a in second collecting element 222B intersects with a straight line joining the center of pixel area 100 and the center of unit pixel 101 that includes second collecting element 222B.

From the standpoint of light collection efficiency, ideally, focus position P is lying on the straight line joining the center of pixel area 100 and the center of unit pixel 101. In this case, second collecting element 222B may be arranged in a manner that grooves 222a in second collecting element 222B extend in a direction orthogonal to the straight line joining the center of pixel area 100 and the center of unit pixel 101. However, even if focus position P is slightly out of the alignment of the center of pixel area 100 and the center of unit pixel 101 that includes second collecting element 222B, light collection efficiency of unit pixel 101 that includes second collecting element 222B can sufficiently be increased by placing focus position P on the center side of pixel area 100.

As mentioned above, the light obliquely incident more greatly on unit pixels 101 that are arranged in the perimeter region of pixel area 100 than unit pixels 101 arranged in the central region of pixel area 100. For this reason, the closer the unit pixel 101 to the central region of pixel area 100, the smaller the offset s of focus position P of second collecting element 222B may be determined, and the closer the unit pixel 101 to the perimeter of pixel area 100, the greater the offset s of focus position P of second collecting element 222B may be determined. For this reason, among unit pixels 101 that include second collecting element 222B, unit pixel 101 disposed closer to the perimeter of pixel area 100 may have a higher average density of formations of grooves 222a in unit pixel 101. In other words, in one aspect of the solid-state imaging device, an average density of formations of grooves 222a in unit pixel 101 further away from the central region of pixel area 100 may be higher than that of unit pixel 101 closer to the central region of pixel area 100.

Ideally, the density of formations of grooves 222a continuously varies outwardly from the central region of pixel area 100. However, pixel area 100 may be segmented into blocks each having a constant density of formations of grooves 222a throughout the block and a block closer to the perimeter of pixel area 100 may have a higher density of formations of grooves 222a, such that the density of formations of grooves 222a changes in a stepwise manner in pixel area 100.

The size of first collecting element 222A depends on, for example, an index of refraction of the collecting element material and a size of unit pixel 101 in which first collecting element 222A is included. Likewise, the size of second collecting element 222B depends on, for example, an index of refraction of the collecting element material and a size of unit pixel 101 in which second collecting element 222B is included. If unit pixel 101 is about 4 μm square, first collecting element 222A can be a planar circular convex lens having a diameter of approximately 4 μm. In this case, depth D of focus is approximately 3.5 μm if the collecting element material is silicon oxide and has a radius of curvature of 2.5 μm. On the other hand, second collecting element 222B may be the same convex lens as first collecting element 222A but with grooves 222a. In this ease, depth D of focus of second collecting element 222B is also approximately 3.5 μm. For example, the minimum width and the maximum depth of grooves 222a can be 90 nm and 500 nm, respectively. By adjusting the positions and the density of formations of grooves 222a, offset s of focus position P in second collecting element 222B may be changed up to about 1 μm. Preferably, the radius of curvature of the convex surface of first collecting element 222A and the radius of curvature of the convex surface of second collecting element 222B are about 10 μm or less.

While FIG. 1 shows the example in which both ends of groove 222a reach the circumference of second collecting element 222B, the present disclosure is not limited thereto.

Figure 5:
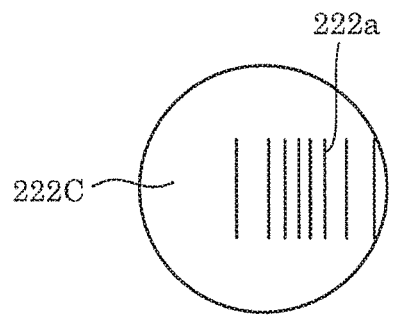
FIG. 5 is a plan view of a first variation of the second collecting element.

FIG. 5 is a plan view of a first variation of the second collecting element according to the present embodiment. As shown in FIG. 5, both ends of grooves 222a may not reach the circumference of second collecting element 222C. Alternatively, one end may reach the circumference of second collecting element 222C and the other end may not.

Figure 6:
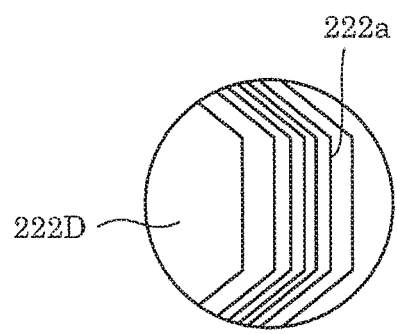
FIG. 6 is a plan view of a second variation of the second collecting element.

FIG. 6 is a plan view of a second variation of the second collecting element according to the present embodiment. As shown in FIG. 6, the second collecting element according to the present embodiment may be second collecting element 222D which has grooves 222a each having flexural points at which the direction of extension of groove 222a changes, rather than linear grooves 222a extending in one direction. It should be noted that groove 222a is not limited to have two flexural points, and may have one flexural point or three or more flexural points.

Figure 7:
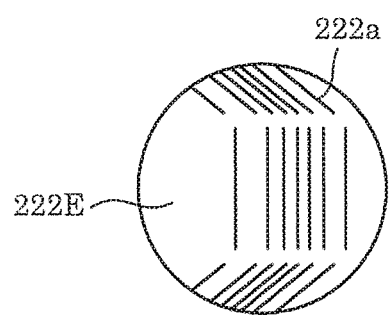
FIG. 7 is a plan view of a third variation of the second collecting element.

FIG. 7 is a plan view of a third variation, of the second collecting element according to the present embodiment. As shown in FIG. 7, instead of providing the flexural points, the second collecting element according to the present embodiment may be second collecting element 222E that has combinations of grooves 222a each of which extends in one direction while they extend in different directions.

Figure 8:
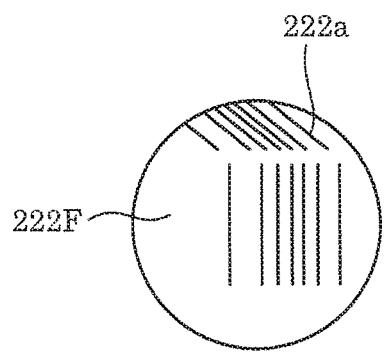
FIG. 8 is a plan view of a fourth variation of the second collecting element.
Figure 9:
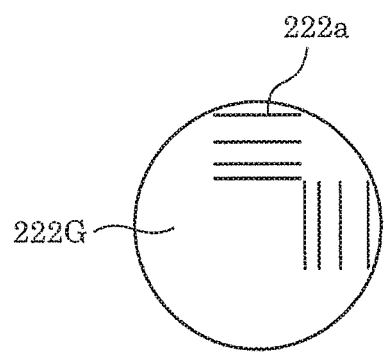
FIG. 9 is a plan view of a fifth variation, of the second, collecting element.

FIG. 8 is a plan view of a fourth variation of the second collecting element according to the present embodiment. FIG. 9 is a plan view of a fifth variation of the second collecting element according to the present embodiment. While each combination of three grooves 222a extends in three different directions in FIG. 7, the second collecting element according to the present embodiment may be second, collecting element 222F or 222G which has combinations of two grooves 222a, each combination extending in two different directions, as shown in FIG. 8 or 9. Alternatively, the second collecting element may include combinations of four or more grooves 222a, each combination extending in four or more different directions. In other words, in one aspect of the solid-state imaging device, the grooves may extend in two or more different directions in at least a portion of the second collecting element.

Alternatively, a configuration of the second collecting element according to the present embodiment may be different depending on where the second collecting element according to the present embodiment is positioned in pixel area 100.

FIG. 10 is a plan view of a first variation of the solid-state imaging device according to the embodiment. As shown in FIG. 10, unit pixels 101 that are disposed on and around a straight line joining the midpoints of facing sides of pixel area 100 each include second collecting element 222C having the configuration as shown in FIG. 5. On the other hand, unit pixels 101 disposed on and around diagonals of pixel area 100 each include second collecting element 222F having the configuration as shown in FIG. 8. Alternatively, second collecting elements 222B, 222D, or 222E may be used in place of second collecting element 222C. Alternatively, second collecting element 222G may be used in place of second collecting element 222F.

If groove 222a extends in two or more directions, a direction in which focus position P is offset is determined by a sum of vectors of the directions. For this reason, a combination of grooves 222a that extend in different directions in unit pixel 101 can finely correspond to a position of unit pixel 101 in pixel area 100.

In the following, a method for fabricating the solid-state imaging device according to the present embodiment is described, with reference to the accompanying drawings.

First, semiconductor substrate 200 is prepared.

Next, as illustrated in (a) and (b) of FIG. 11, collecting-element forming film 252 comprising the collecting element material is formed over semiconductor substrate 200. For example, collecting-element forming film 252 can be a silicon oxide film. A thickness of collecting-element forming film. 252 may be determined, according to a requisite size of collecting elements to be formed, but the thickness can be 1.5 μm, for example.

Figure 12A:
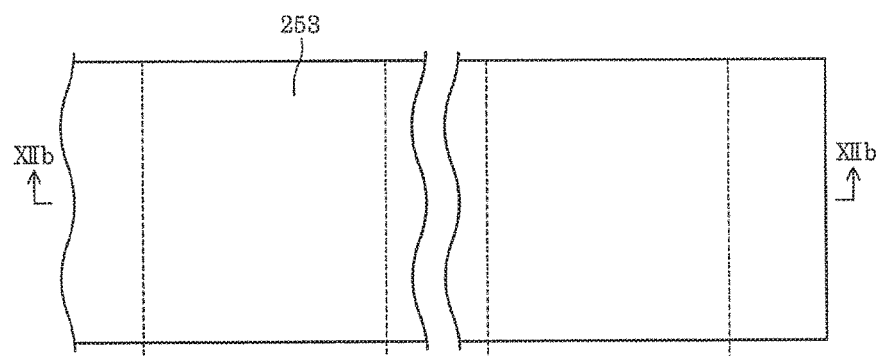
FIG. 12 shows (a) a plan view illustrating a step in the method for fabricating the solid-state imaging device according to the embodiment, and (b) a cross sectional view taken along XIIb-XIIb in (a)
Figure 12B:
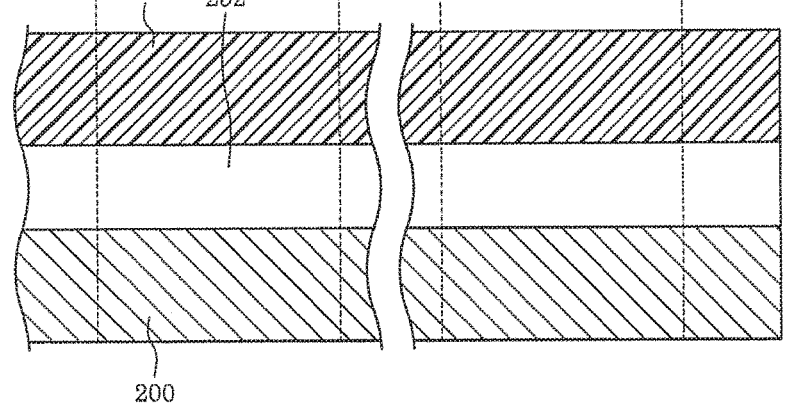

Next, as illustrated in (a) and (b) of FIG. 12, resist film 253 is formed over collecting element forming film 252. Resist film 253 can be, for example, a positive photo-resist. Resist film 253 can be deposited by spin-coating, for example. The thickness of resist film 253 can be about 250 nm, for example.

Next, as illustrated in (a) and. (b) of FIG. 13, groove pattern 253a is formed in a predetermined area of resist film 253 by photolithography. For example, an argon-fluorine (ArF) light source having a wavelength of 193 nm may be used for exposure of groove pattern 253a. Linear groove pattern 253a having a minimum dimension of about 90 nm can readily be formed, using polarized illumination which emits light beams in one direction. It should be noted that, for example, a krypton-fluorine (KrF) laser light source having a wavelength of 248 nm or a fluorine (F2) laser light source having a wavelength of 157 nm may be used instead of the ArF light source. Alternatively, dipole illumination may be used instead of polarized illumination.

In the method for fabricating the solid-state imaging device, the step of forming the grooves may include forming a resist film, which has a groove pattern having grooves, over the collecting-element forming film by photolithography using dipole illumination or polarized illumination, and etching the collecting-element forming film using the resist film as a mask FIG. 13 illustrates an example of groove pattern 253a. The number, spacing, direction, etc. of the grooves in groove pattern 253a are adjusted according to a location in pixel area 100.

Figure 14A:
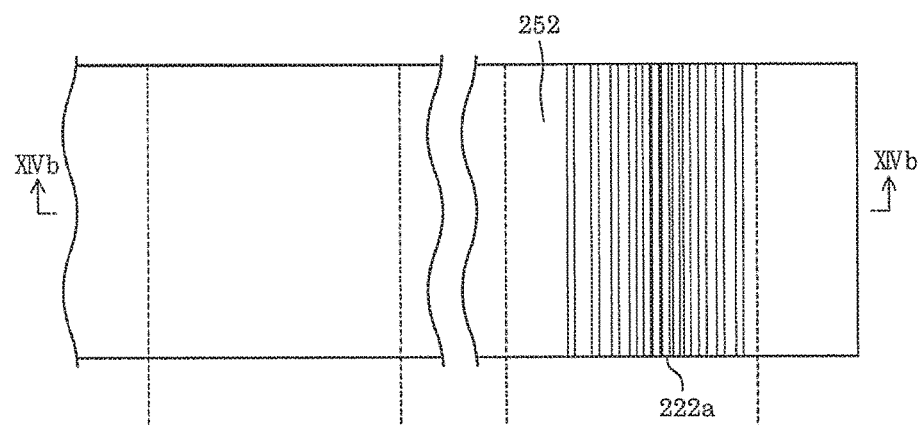
FIG. 14 shows (a) a plan view illustrating a step in the method for fabricating the solid-state imaging device according to the embodiment, and (b) a cross sectional view taken along XIVb-XIVb in (a)
Figure 14B:
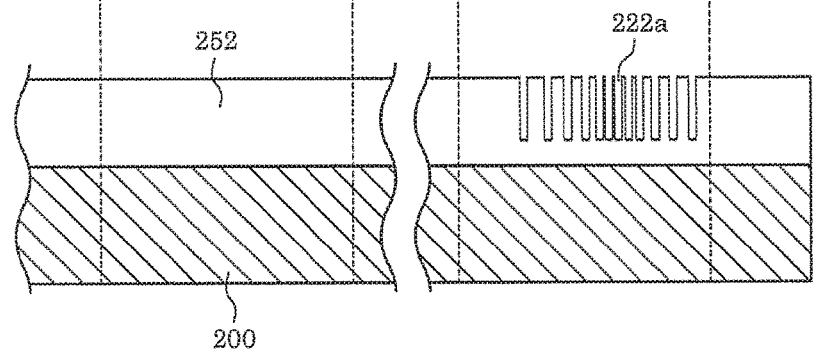

Next, as illustrated in (a) and (b) of FIG. 14, grooves 222a are formed by etching collecting-element forming film 252 using, as a mask, resist film 253 having groove pattern 253a formed thereon. Resist film 253 is removed thereafter. While (b) of FIG. 14 illustrates the example in which grooves 222a that have generally vertical walls are formed, grooves 222a may have walls that are forward tapered or reverse tapered.

Figure 15A:
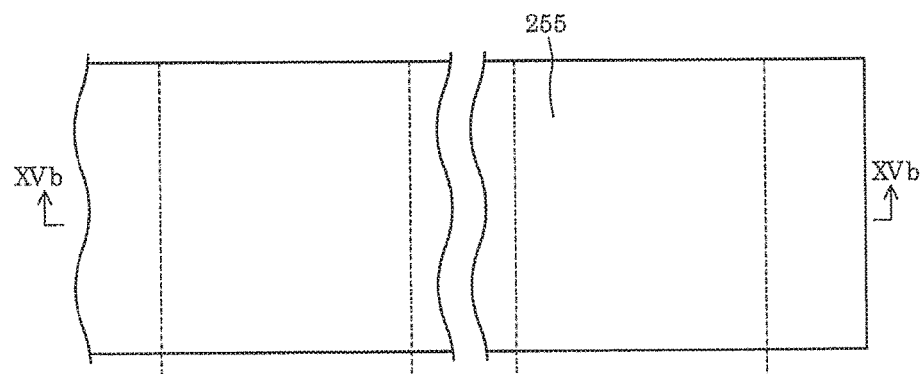
FIG. 15 shows (a) a plan view illustrating a step in the method for fabricating the solid-state imaging device according to the embodiment, and (b) a cross sectional view taken along XVb-XVb in (a)
Figure 15B:
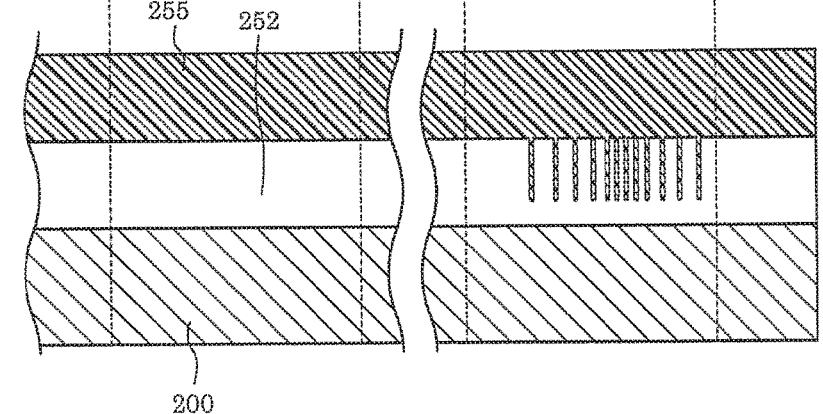

Next, as illustrated in (a) and (b) of FIG. 15, resist film 255 is formed over collecting-element forming film 252. Resist film 255 can be, for example, a positive photo-resist. Resist film 255 can be deposited by spin-coating, for example. The thickness of resist film 255 can be about 1.5 µm, for example.

Next, as illustrated in (a) and (b) of FIG. 16, resist film 255 is patterned by photolithography. For example, resist film 255 can be patterned to a cylindrical shape having a diameter of 4.0 µm. In this case, for example, an i-line light source having a wavelength of 365 nm may be used as an exposure light source. It should be noted that, for example, a g-line light source having a wavelength of 436 nm or the KrF laser light source may also be used.

Figure 17A:
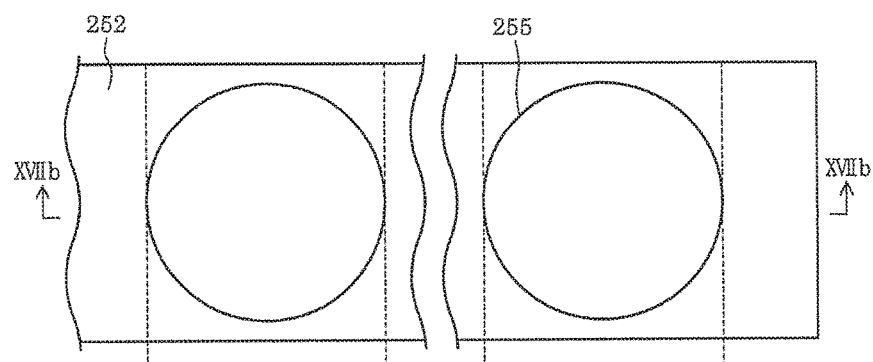
FIG. 17 shows (a) a plan view illustrating a step in the method for fabricating the solid-state imaging device according to the embodiment, and (b) a cross sectional view taken along XVIIb-XVIIb in (a)
Figure 17B:
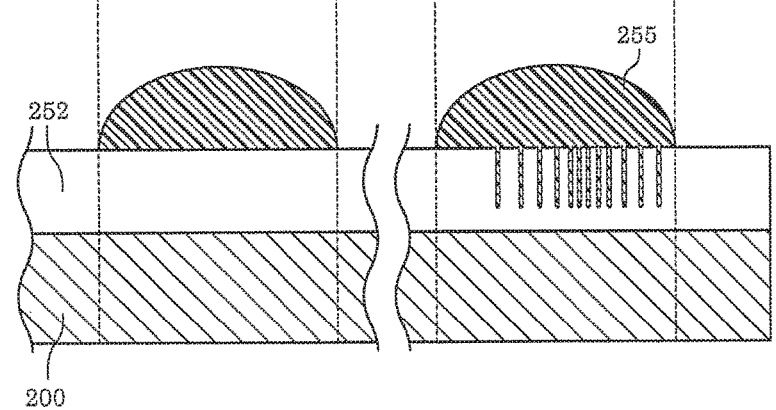

Next, as illustrated in (a) and (b) of FIG. 17, resist film 255 is deformed by heat treatment using a hot plate, to give resist film 255 a lens form. The heat treatment can be carried out at, for example, 190 degrees Celsius. The radius of curvature of resist film 255 in the lens form can be, for example, 2.5 µm.

Next, collecting-element forming film 252 is etched using resist film 255 as a mask. As illustrated in (a) and (b) of FIG. 18, resist film 255 is removed thereafter. This forms first collecting elements 222A without grooves 222a in the central region of pixel area 100 and second collecting elements 222B having grooves 222a in the regions of pixel area 100 not including the central region. Preferably, the maximum depth of grooves 222a is about 500 nm.

According to the above fabrication method, grooves 222a the positions of the bottoms of which are constant can be formed since grooves 222a are formed after the collecting element is formed in a lens form. Deep grooves 222a can be formed in a thick portion of second collecting element 222B, and shallow grooves 222a can be formed in a thin portion. In other words, the above fabrication method provides advantages of ease of micro-processing and forming grooves 222a precisely. However, the positions of the bottoms grooves 222a may not be constant. Also for example, grooves 222a which have a constant depth from the surface of second collecting element 222B can be formed.

Figure 19A:
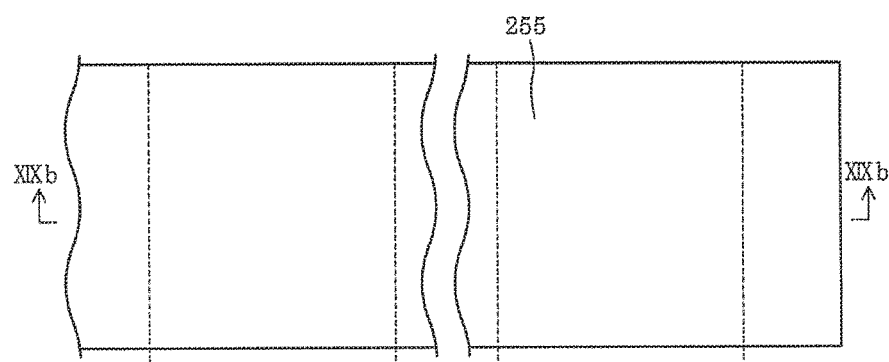
FIG. 19 shows (a) a plan view illustrating a step in a variation of the method for fabricating the solid-state imaging device according to the embodiment, and (b) a cross sectional view taken along XIXb-XIXb in (a)
Figure 19B:
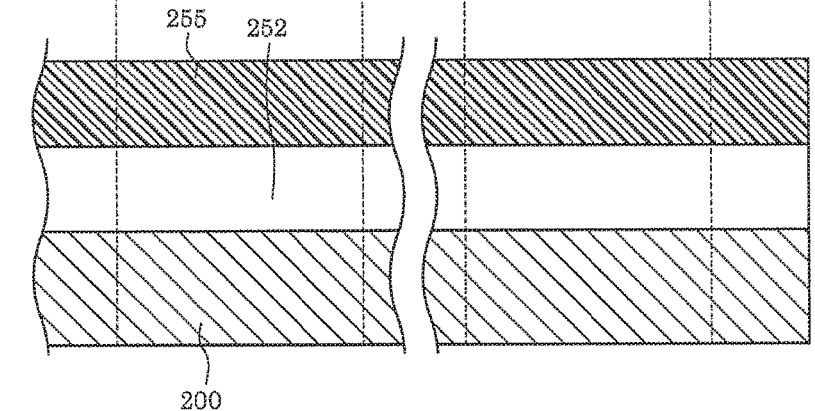

For example, grooves 222a that have a constant depth from the collecting element surface can be formed in the following manner. First, as illustrated in (a) and (b) of FIG. 19, collecting-element forming film 252 is formed over semiconductor substrate 200 in which a photoelectric conversion element or the like is formed, and resist film 255 is formed over collecting-element forming film 252. Resist film 255 can be, for example, a positive photo-resist. Resist film 255 can be deposited by spin-coating, for example.

Figure 20A:
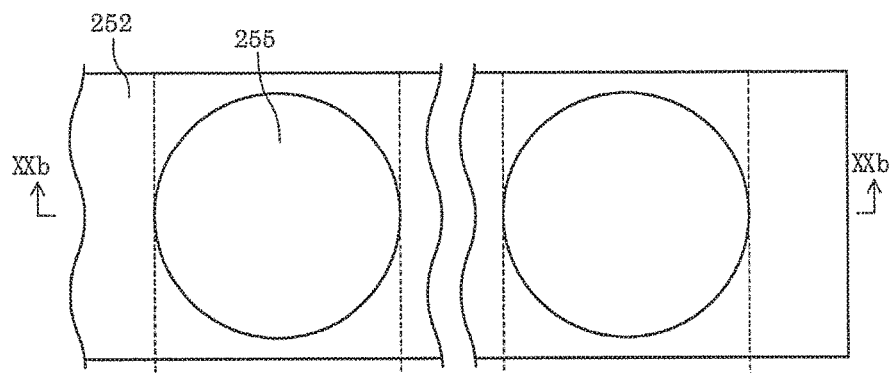
FIG. 20 shows (a) a plan view illustrating a step in the variation of the method for fabricating the solid-state imaging device according to the embodiment, and (b) a cross sectional view taken along XXb-XXb in (a)
Figure 20B:
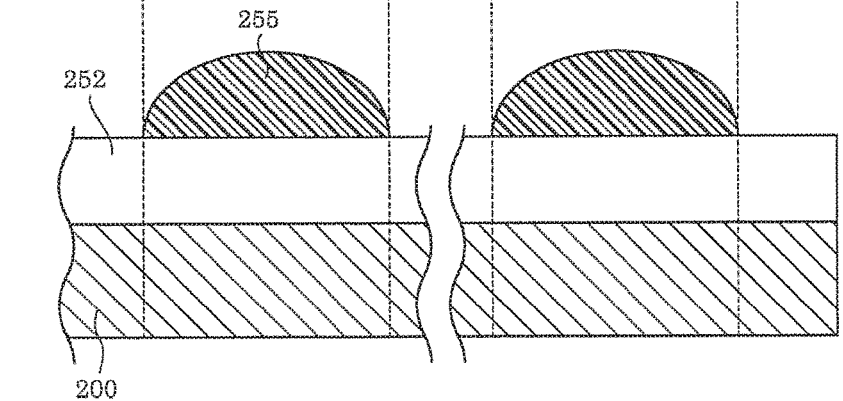

Next, resist film 255 is patterned by photolithography. Then, as illustrated in (a) and (b) of FIG. 20, resist film 255 is heat treated to give resist film 255 a lens form. For example, an i-line light source or the like may be used as an exposure light source of the photolithography. The heat treatment can be carried out at, for example, about 190 degrees Celsius, using a hot plate.

Figure 21A:
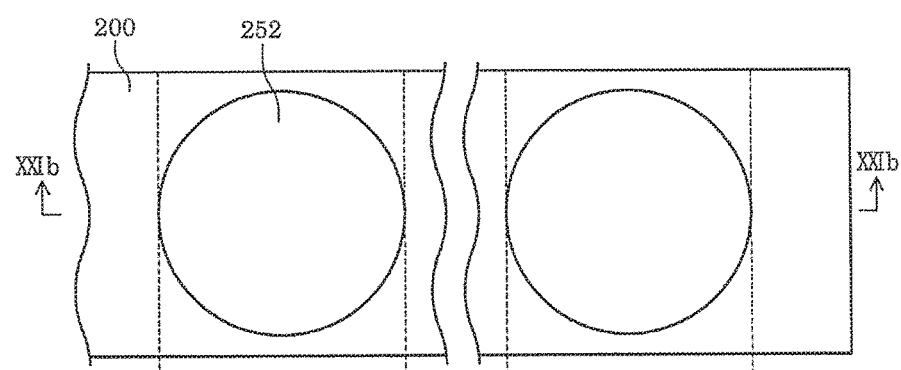
FIG. 21 shows (a) a plan view illustrating a step in the variation of the method for fabricating the solid-state imaging device according to the embodiment, and (b) a cross sectional view taken along XXIb-XXIb in (a)
Figure 21B:
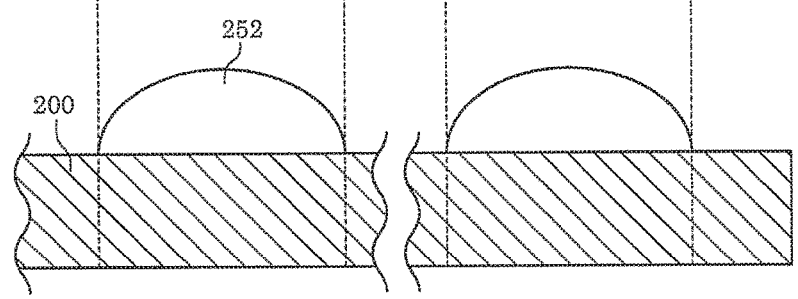

Next, collecting-element forming film 252 is etched using resist film 255 as a mask to give collecting-element forming film 252 the lens form. Then, resist film 255 is removed to provide the configuration illustrated in (a) and (b) of FIG. 21.

Figure 22A:
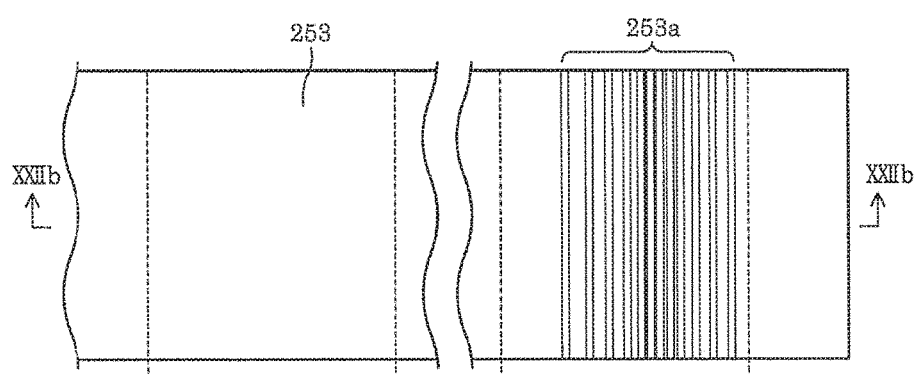
FIG. 22 shows (a) a plan view illustrating a step in the variation of the method for fabricating the solid-state imaging device according to the embodiment, and (b) a cross sectional view taken along XXIIb-XXIIb in (a)
Figure 22B:
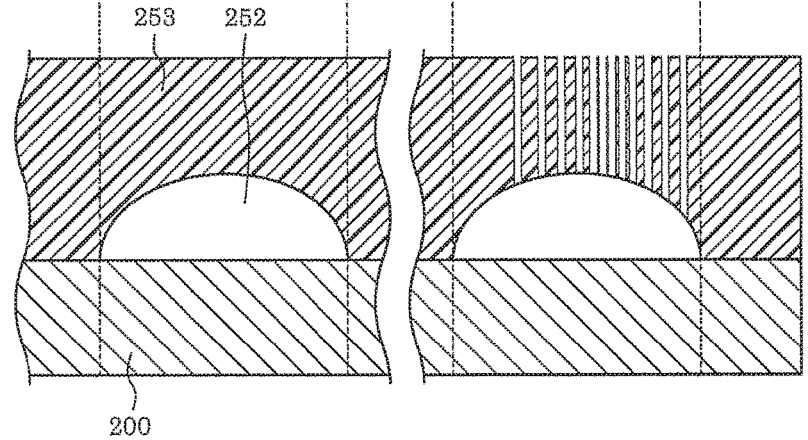

Next, as illustrated in (a) and (b) of FIG. 22, resist film 253 is formed over collecting-element forming film 252, and groove pattern 253a is formed in a predetermined area of resist film 253 by photolithography. Resist film 253 can be, for example, a positive photo-resist. Resist film 253 can be deposited by spin-coating, for example. The thickness of resist film 253 can be about 250 nm, for example. For example, the ArF laser light source or the like can be used for exposure of groove pattern 253a. Linear groove pattern 253a having a minimum dimension of about 90 nm can readily be formed in resist film 253, using polarized illumination which emits light beams in one direction.

Next, collecting-element forming film 252 is etched using resist film 253 as a mask, and thereby grooves 222a are formed. Resist film 253 is removed thereafter. This forms first collecting elements 222A without grooves 222a in the central region of pixel area 100, as illustrated in (a) and (b) of FIG. 23. Meanwhile, second collecting elements 222B having grooves 222a that have a constant depth is formed in the regions of pixel area 100 not including the central region.

Such a fabrication method provides advantages of ease of design since an effective index of refraction of the collecting element can be determined only by a density of formation of groove pattern 253a in resist film 253.

While the above example of the fabrication method according to the present embodiment uses a single-layer resist to process collecting-element forming film 252, anti-reflective coating or the like may be utilized in combination with the single-layer resist. Alternatively, collecting-element forming film 252 may be etched two separate times. Furthermore, collecting-element forming film 252 may be processed by double patterning. For example, lithography-etching-lithography-etching (LELE) double patterning which carries out exposure twice and etching twice can be utilized to process collecting-element forming film 252. Alternatively, the exposure and the etching each may be carried out a number of times. Alternatively, a method for developing a resist pattern through a number of exposures can be carried out. Self-align-double-patterning (SADP) can be utilized to process collecting-element forming film 252, which deposits and etches side walls of grooves using, as a guide, an exposed or developed resist pattern or a pattern obtained by etching a resist pattern.

While the back side illumination solid-state imaging device and the method for fabricating the same have been described above, the solid-state imaging device and the method for fabricating the same according to the present disclosure are also applicable to a front-side illuminated solid-state imaging device which includes line portion 203 between color filter 221 and photoelectric converter 201.

Figure 24:
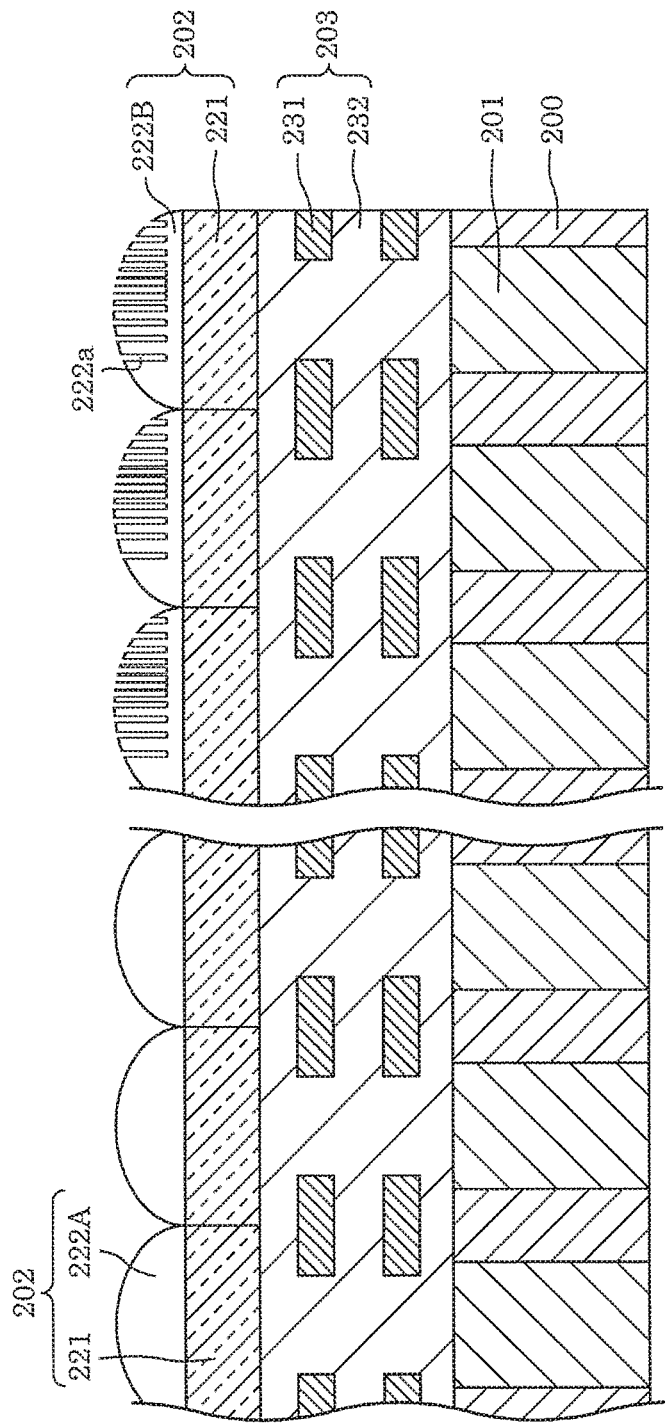
FIG. 24 is a cross sectional view of a second variation of the solid-state imaging device according to the embodiment.

FIG. 24 is a cross sectional view of a second variation of the solid-state imaging device according to the embodiment. The front-side illuminated solid-state imaging device shown in FIG. 24 has enhanced light collection efficiency by including second collecting elements 222B having grooves 222a.

Figure 25:
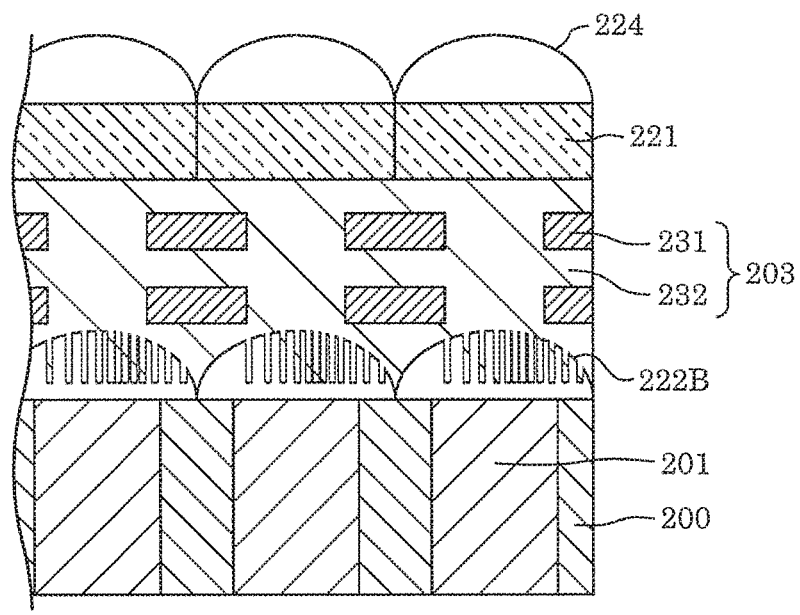
FIG. 25 is a cross sectional view of a third variation of the solid-state imaging device according to the embodiment.

FIG. 25 is a cross sectional view of a third variation of the solid-state imaging device according to the embodiment. As shown in FIG. 25, collecting element 224, which is a typical convex lens, may be disposed over color filter 221, and second collecting element 222B having grooves 222a may be disposed between line portion 203 and photoelectric converter 201.

Figure 26:
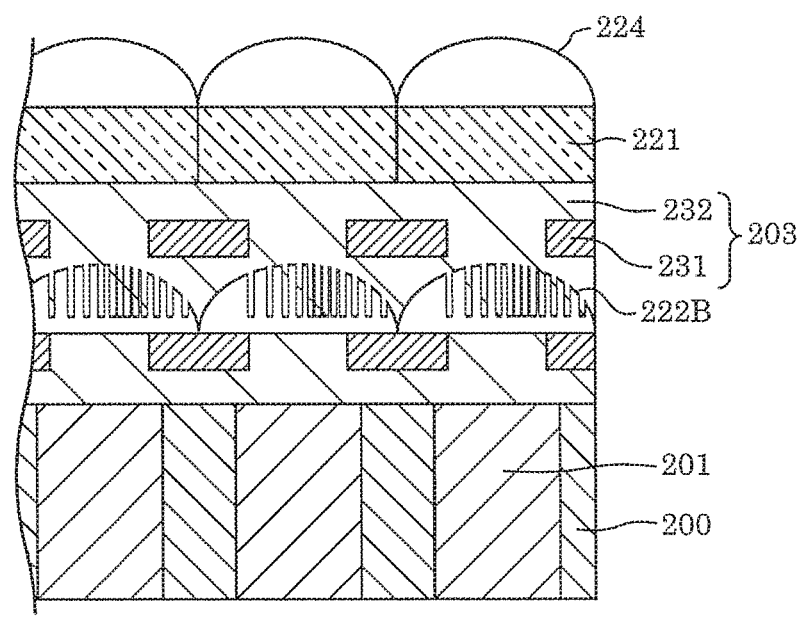
FIG. 26 is a cross sectional view of a fourth variation of the solid-state imaging device according to the embodiment.

FIG. 26 is a cross sectional view of a fourth variation of the solid-state imaging device according to the embodiment. As shown in FIG. 26, second collecting element 222B may be disposed in line portion 203. Enhanced light collection efficiency can be achieved even if second collecting element 222B is disposed between color filter 221 and photoelectric converter 201, as the configurations shown in FIGS. 25 and 26. In these configurations, for example, a silicon nitride film which has a higher index of refraction than an insulating film material may be used as the collecting element material forming second collecting element 222B, if silicon oxide is used as insulating film 232 of line portion 203, for example. This can add light collection capabilities to second collecting element 222B.

While the above embodiment and the variations thereof have been described with reference to the collecting element having a planar circular outline, the collecting element may be in a planar shape an outline of which has two or more rotational symmetries.

Figure 27:
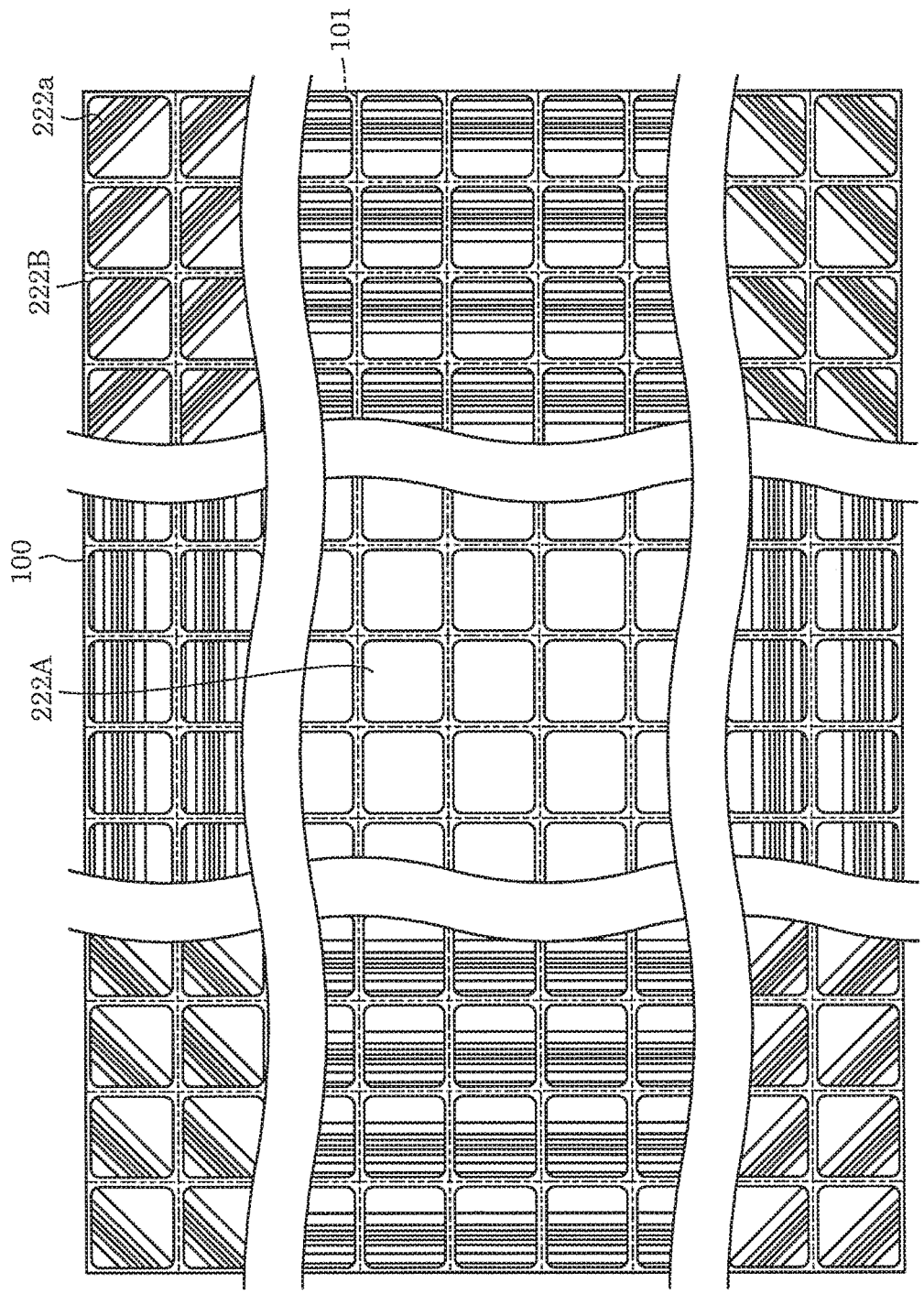
FIG. 27 is a plan view of a fifth variation of the solid-state imaging device according to the embodiment.
Figure 28:
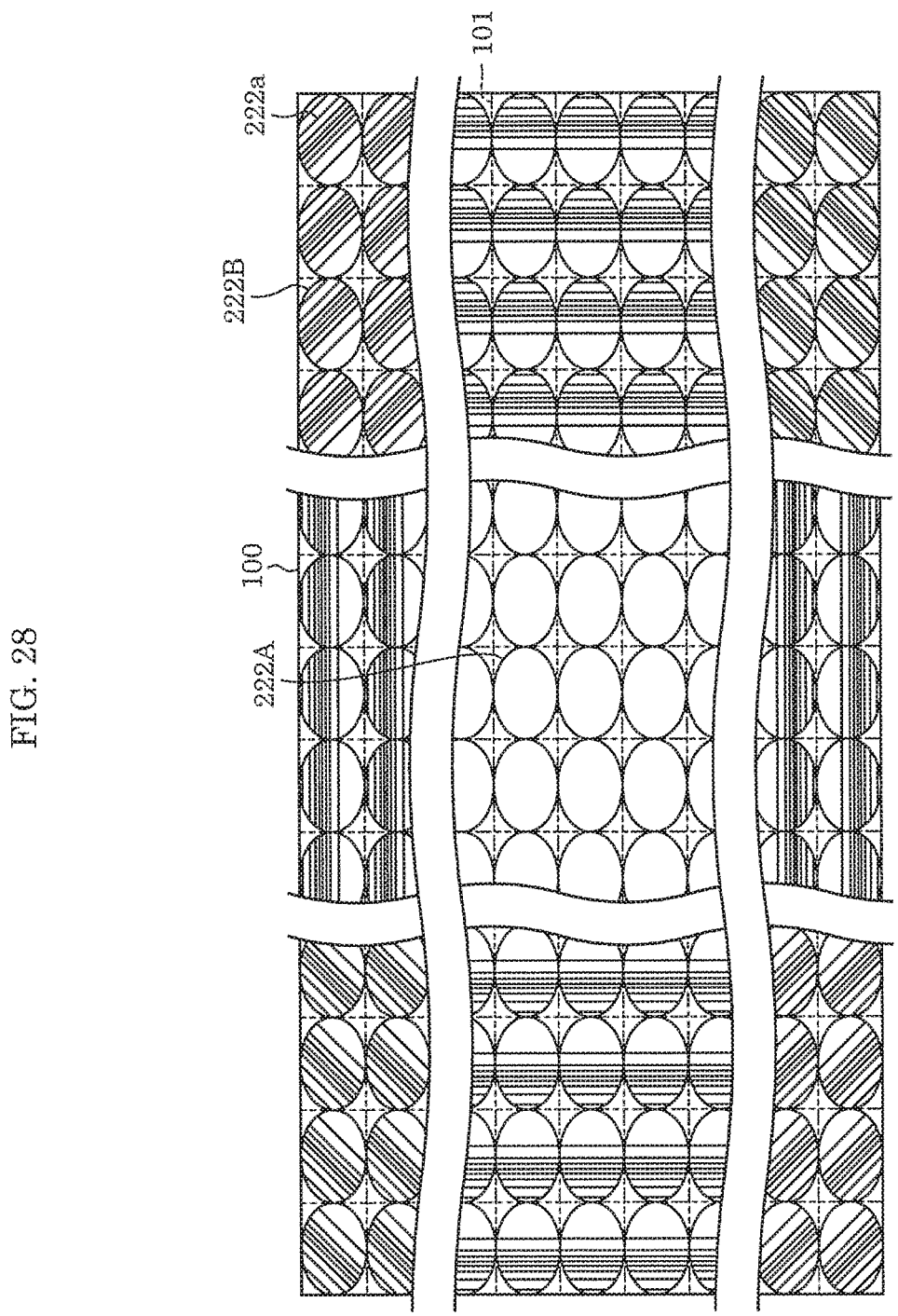
FIG. 28 is a plan view of a sixth variation of the solid-state imaging device according to the embodiment.
Figure 29:
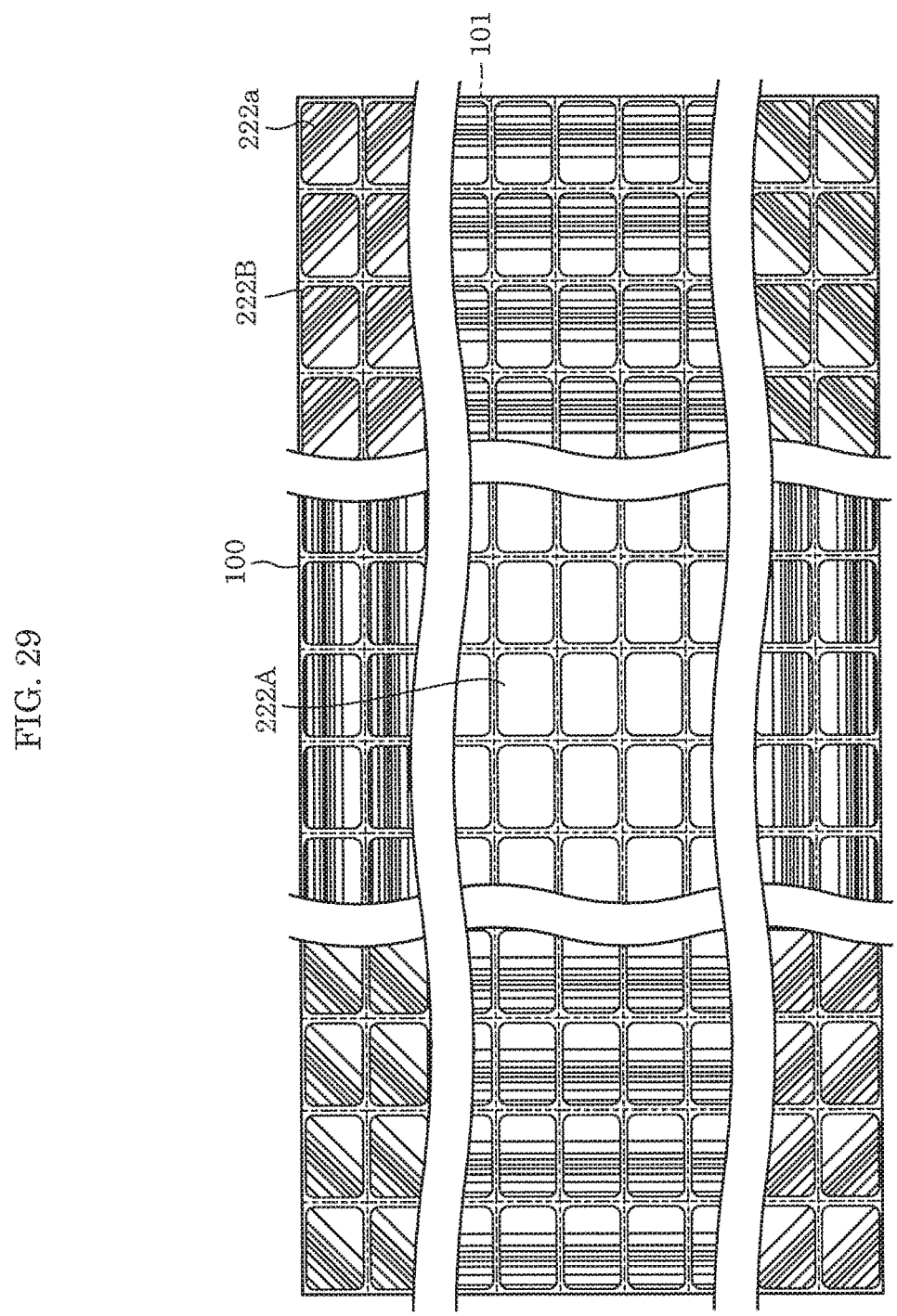
FIG. 29 is a plan view of a seventh variation of the solid-state imaging device according to the embodiment.

FIG. 27 is a plan view of a fifth variation of the solid-state imaging device according to the embodiment. FIG. 28 is a plan view of a sixth variation of the solid-state imaging device according to the embodiment. FIG. 29 is a plan view of a seventh variation of the solid-state imaging device according to the embodiment. The outline of the collecting element can be, for example, planar square as illustrated in FIG. 27. Alternatively, the outline of the collecting element can be planar oval as illustrated in FIG. 28, or planar rectangular as illustrated in FIG. 29. Planar oval or planar rectangular collecting elements are useful when unit pixels 101 have different aspect ratios.

Alternatively, the collecting element material can be $TiO_2$, $ZrO_2$, $Nb_2O_5$, $Ta_2O_5$, $Si_3N_4$, or $Si_2N_3$, etc. in place of silicon oxide.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The solid-state imaging device and the method for fabricating the same according to the present disclosure readily achieve collecting elements each of which has a short focal length and provide uniformity in light collection efficiency of pixels. The solid-state imaging device and the method for fabricating the same according to the present; disclosure are useful as a solid state imaging device and a method for fabricating the same.

What is claimed is:
1. A solid-state imaging device comprising
unit pixels arrayed two-dimensionally in a pixel area of a substrate,
the unit pixels including, in one-to-one correspondence: photoelectric converters; and
collecting elements which collect incident light, the collecting elements including:
a first collecting element having a convex surface, the first collecting element being formed in a unit pixel disposed in a central region of the pixel area among the unit pixels; and
a second collecting element having a convex surface and grooves having widths less than or equal to a wavelength of the incident light, the second collecting element being formed in a unit pixel disposed in a region of the pixel area not including the central region, among the unit pixels, wherein
the second collecting element has, in plan view of the substrate: a sparse region; and a dense region in which a density of formations of the grooves is higher than the density of formations of the grooves in the sparse region, and
the sparse region of the second collecting element is positioned closer to the central region of the pixel area than the dense region of the second collecting element is.
2. The solid-state imaging device according to claim 1, wherein
the widths of the grooves are $\lambda/2n$ or less,
where $\lambda$ represents the wavelength of the incident light and n represents an index of refraction of a material forming the second collecting element.
3. The solid-state imaging device according to claim 1, wherein
the density of formations of the grooves in the dense region is higher on a sparse region side than in a central region of the dense region.
4. The solid-state imaging device according to claim
among the unit pixels, the density of formations of the grooves in a unit pixel at a first distance from the central region of the pixel area is higher than the density of formations of the grooves in a unit pixel at a second distance from the central region of the pixel area, the first distance being greater than the second distance.
5. The solid-state imaging device according to claim 1, wherein
the grooves are disposed in parallel to one another.
6. The solid-state imaging device according to claim 1, wherein
the grooves in the second collecting element linearly extend in a direction intersecting a straight line joining a center of the pixel area and a center of the unit pixel that includes the second collecting element.
7. The solid-state imaging device according to claim 1, wherein
the grooves extend in two or more different directions in at least a portion of the second collecting element.
8. The solid-state imaging device according to claim 1, wherein
the collecting elements are planar oval, or planar rectangular.
9. The solid-state imaging device according to claim 1, wherein
positions of bottoms of the grooves in the second collecting element are constant.
10. The solid-state imaging device according to claim 1, wherein
the grooves in the second collecting element have a constant depth.

11. The solid-state imaging device according to claim 1, wherein
the convex surface of the first collecting element and the convex surface of the second collecting element each have a radius of curvature of 10 μm or less.

12. The solid-state imaging device according to claim 1, wherein
the unit pixels each include:
one of the photoelectric converters on a first major surface of the substrate; and
a line portion on a second major surface of the substrate, the first major surface and the second major surface being opposing surfaces of the substrate, and
the second collecting element is disposed over the first major surface.

13. The solid-state imaging device according to claim 1, wherein
the unit pixels each include:
one of the photoelectric converters on a first major surface of the substrate;
a line portion over the first major surface of the substrate; and
a color filter over the line portion, and
the second collecting element is disposed between the color filter and the photoelectric converter.

* * * * *